US012672544B2

(12) United States Patent (10) Patent No.: US 12,672,544 B2
Niwa et al. (45) Date of Patent: Jun. 30, 2026

(54) SEMICONDUCTOR DEVICE

(71) Applicant: ROHM CO., LTD., Kyoto (JP)

(72) Inventors: Daichi Niwa, Kyoto (JP); Koshun Saito, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 723 days.

(21) Appl. No.: 17/911,063

(22) PCT Filed: Jan. 28, 2021

(86) PCT No.: PCT/JP2021/003011
§ 371 (c)(1),
(2) Date: Sep. 12, 2022

(87) PCT Pub. No.: WO2021/199635
PCT Pub. Date: Oct. 7, 2021

(65) Prior Publication Data
US 2023/0105834 A1 Apr. 6, 2023

(30) Foreign Application Priority Data

Mar. 30, 2020 (JP) ................................. 2020-060722
Mar. 30, 2020 (JP) ................................. 2020-060723

(51) Int. Cl.
H10W 42/00 (2026.01)
H10W 70/40 (2026.01)
(Continued)

(52) U.S. Cl.
CPC ....... H10W 42/121 (2026.01); H10W 70/417 (2026.01); H10W 70/457 (2026.01);
(Continued)

(58) Field of Classification Search
CPC ......... H01L 23/49568; H01L 23/49548; H01L 23/562; H01L 23/49541; H01L 24/48;
(Continued)

(56) References Cited

U.S. PATENT DOCUMENTS 5,530,284 A 6/1996 Bailey
2006/0017159 A1* 1/2006 Kamata ................... H01L 24/03
257/784

(Continued)

FOREIGN PATENT DOCUMENTS

JP S5434678 A 3/1979
JP H08264697 A 10/1996
(Continued)

OTHER PUBLICATIONS

Notice of Reasons for Refusal issued for Japanese Patent Application No. 2022-511579, Dispatch date: Oct. 8, 2024, 39 pages including English machine translation.
(Continued)

*Primary Examiner* — Mouloucoulaye Inoussa
(74) *Attorney, Agent, or Firm* — HSML P.C.

(57) ABSTRACT

A semiconductor device includes a substrate, a semiconductor element, a connection pad, a plated layer, a wire, and an encapsulation resin. The substrate includes a main surface. The semiconductor element is mounted on the main surface and includes a main surface electrode. The connection pad is formed of Cu, arranged with respect to the substrate, separated from the substrate, and includes a connection surface. The plated layer is formed of Ni and partially covers the connection surface. The wire is formed of Al and bonded to the main surface electrode and the plated layer. The encapsulation resin encapsulates the semiconductor element, the connection pad, the plated layer, and the wire.

13 Claims, 15 Drawing Sheets

(51) Int. Cl.

| | |
|---|---|
| *H10W 72/00* | (2026.01) |
| *H10W 72/50* | (2026.01) |
| *H10W 72/59* | (2026.01) |
| *H10W 72/90* | (2026.01) |
| *H10W 74/10* | (2026.01) |
| *H10W 90/00* | (2026.01) |

(52) U.S. Cl.
CPC ....... *H10W 70/465* (2026.01); *H10W 70/481*
(2026.01); *H10W 74/111* (2026.01); *H10W*
*72/07552* (2026.01); *H10W 72/527* (2026.01);
*H10W 72/5363* (2026.01); *H10W 72/5524*
(2026.01); *H10W 72/59* (2026.01); *H10W*
*72/952* (2026.01); *H10W 90/756* (2026.01)

(58) Field of Classification Search
CPC ... H01L 24/05; H01L 24/42; H01L 23/49513;
H01L 23/49562; H01L 23/3107; H01L
24/49; H01L 23/4952; H01L 23/49582;
H01L 23/49503; H01L 24/32; H01L
21/565; H01L 21/4842; H01L 21/681;
H01L 21/4825; H01L 23/3114; H01L
23/3142; H01L 23/49586; H01L 23/3677;
H01L 21/4821; H01L 23/31; H01L
2224/05147; H01L 2924/10272; H01L
2924/13091; H01L 2224/4903; H01L
2224/04042; H01L 2224/48091; H01L
2224/04026; H01L 2224/05155; H01L
2224/29116; H01L 2224/06181; H01L
2224/85205; H01L 2224/48247; H01L
2224/48472; H01L 2224/48245; H01L
2224/32245; H01L 2224/05647; H01L
2224/48507; H01L 2224/2919; H01L
2224/29191; H01L 2224/85065; H01L
2224/85207; H01L 2224/85075; H01L
2224/85464; H01L 2924/181; H01L
2224/40499; H01L 2224/84455; H01L
2224/84447; H01L 2224/73263; H01L
2224/85411; H01L 2224/45144; H01L
2224/92247; H01L 2224/73265; H01L
24/85; H10D 30/60; H10D 62/8325;
G06T 7/70; G06T 7/0004
See application file for complete search history.

(56) References Cited

U.S. PATENT DOCUMENTS

| | | | | |
|---|---|---|---|---|
| 2009/0008775 A1* | 1/2009 | Tanaka | ................... | H01L 24/48 |
| | | | | 257/737 |
| 2009/0096100 A1* | 4/2009 | Kajiwara | ................ | H01L 24/29 |
| | | | | 252/512 |
| 2011/0260305 A1* | 10/2011 | Saboco | ................... | H01L 24/06 |
| | | | | 257/670 |
| 2011/0290863 A1* | 12/2011 | Kajiwara | ............. | C22C 1/0466 |
| | | | | 252/76 |
| 2013/0009300 A1* | 1/2013 | Yato | ........................ | H01L 24/49 |
| | | | | 257/676 |
| 2014/0124912 A1* | 5/2014 | Kaneda | ................... | H01L 24/49 |
| | | | | 257/676 |
| 2014/0264383 A1* | 9/2014 | Kajiwara | ............. | H01L 23/562 |
| | | | | 257/77 |
| 2014/0284782 A1* | 9/2014 | Kimura | ............ | H01L 23/49503 |
| | | | | 257/676 |
| 2016/0005671 A1* | 1/2016 | Tsuyuno | ................. | H01L 23/24 |
| | | | | 257/789 |
| 2016/0315054 A1* | 10/2016 | Kajihara | ............. | H01L 23/4952 |
| 2018/0096961 A1* | 4/2018 | Hashizume | ............. | H01L 24/48 |
| 2019/0043791 A1* | 2/2019 | Haga | ...................... | H01L 24/83 |
| 2019/0148251 A1* | 5/2019 | Okabe | ................. | H01L 23/3135 |
| | | | | 257/788 |
| 2019/0157196 A1* | 5/2019 | Sonehara | ............ | H01L 23/4952 |
| 2020/0373227 A1* | 11/2020 | Futamura | ............ | H01L 23/4827 |
| 2021/0098346 A1* | 4/2021 | Okuyama | ............... | H01L 24/85 |
| 2021/0125891 A1* | 4/2021 | Kajihara | ............. | H01L 21/4821 |
| 2021/0175141 A1* | 6/2021 | Kajihara | ............... | H01L 21/565 |
| 2021/0193590 A1* | 6/2021 | Wang | ........................ | G06T 7/70 |
| 2021/0305111 A1* | 9/2021 | Kajihara | ............ | H01L 23/3677 |
| 2021/0313291 A1* | 10/2021 | Zhang | ............... | H01L 23/49861 |

FOREIGN PATENT DOCUMENTS

| | | | |
|---|---|---|---|
| JP | 2011071566 A | 4/2011 | |
| JP | 2017174951 A | 9/2017 | |
| JP | 2017208434 A | 11/2017 | |
| JP | 2018056451 A | 4/2018 | |
| WO | 2015151273 A1 | 10/2015 | |

OTHER PUBLICATIONS

International Search Report and Written Opinion issued for International Patent Application No. PCT/JP2021/003011, Date of mailing: Apr. 27, 2021, 10 pages including English translation of Search Report.

Notice of Reasons for Refusal issued for Japanese Patent Application No. 2025-008993, Dispatch date: Aug. 12, 2025, 6 pages including English machine translation.

* cited by examiner

Fig.11

SEMICONDUCTOR DEVICE

TECHNICAL FIELD

The following disclosure relates to a semiconductor device.

BACKGROUND ART

A semiconductor device includes a substrate, a semiconductor element such as a power transistor mounted on the substrate, a drive lead, a control lead, and an encapsulation resin (for example, refer to Patent Document 1). The drive lead includes a drive pad that is connected to a source electrode of the semiconductor element by drive wires. The control lead includes a control pad that is connected to a gate electrode of the semiconductor element by a control wire. The encapsulation resin encapsulates at least the semiconductor element.

PRIOR ART DOCUMENT

Patent Document

Patent Document 1: Japanese Laid-Open Patent Publication No. 2017-174951

SUMMARY OF THE INVENTION

Problems that the Invention is to Solve

Aluminum wires may be used as the drive wires and the control wire. In this case, copper is used in the substrate, the drive lead, and the control lead. Thus, an intermetallic compound will be formed between the wires and the leads. The heat produced when, for example, the semiconductor device functions may accelerate the growth of intermetallic compound and lower the reliability of the semiconductor device.

One objective of the present disclosure is to provide a semiconductor device that allows for the use of aluminum wires without lowering the connection reliability.

Means for Solving the Problems

A semiconductor device in one mode of the present disclosure includes a substrate, a semiconductor element, a connection pad, a plated layer, a wire, and an encapsulation resin. The substrate includes a main surface. The semiconductor element is mounted on the main surface and includes a main surface electrode oriented in the same direction as the main surface. The connection pad is formed of Cu, separated from the substrate in a first direction that is parallel to the main surface, and includes a connection surface oriented in the same direction as the main surface. The plated layer is formed of Ni and partially covers the connection surface. The wire is formed of Al and includes a first end bonded to the main surface electrode and a second end bonded to the plated layer. The encapsulation resin encapsulates the semiconductor element, the connection pad, the plated layer, and the wire.

A semiconductor device in another mode of the present disclosure includes a substrate, a semiconductor element, a connection pad, a wire, and an encapsulation resin. The substrate includes a main surface. The semiconductor element is mounted on the main surface and includes a main surface electrode oriented in the same direction as the main surface. The connection pad is separated from the substrate in a first direction that is parallel to the main surface. The wire includes a first end bonded to the main surface electrode and a second end bonded to the connection pad. The encapsulation resin encapsulates the semiconductor element, the connection pad, and the wire. The wire is formed of Al. The connection pad includes a base material and a plated layer. The base material is formed of Cu and includes an upper surface oriented in the same direction as the main surface. The plated layer is formed of Ni and covers the upper surface of the base material. The plated layer is a rough-surface plated layer having a rougher surface than the upper surface of the base material.

Effects of the Invention

In one general aspect, the present disclosure provides a semiconductor device that allows for the use of aluminum wires without lowering the connection reliability.

BRIEF DESCRIPTION OF THE DRAWINGS

FIG. 11 is a schematic rear view of the semiconductor device in accordance with the second embodiment.

MODES FOR CARRYING OUT THE INVENTION

Embodiments of a semiconductor device will now be described with reference to drawings. The embodiments hereinafter are to exemplify configurations and methods for embodying technical concepts and not to limit materials, shapes, structures, arrangements, dimensions, and the like of components as described below. Various modifications may be added to the embodiments described below.

First Embodiment

A semiconductor device of a first embodiment will now be described with reference to FIGS. 1 to 6.

Figure 1:
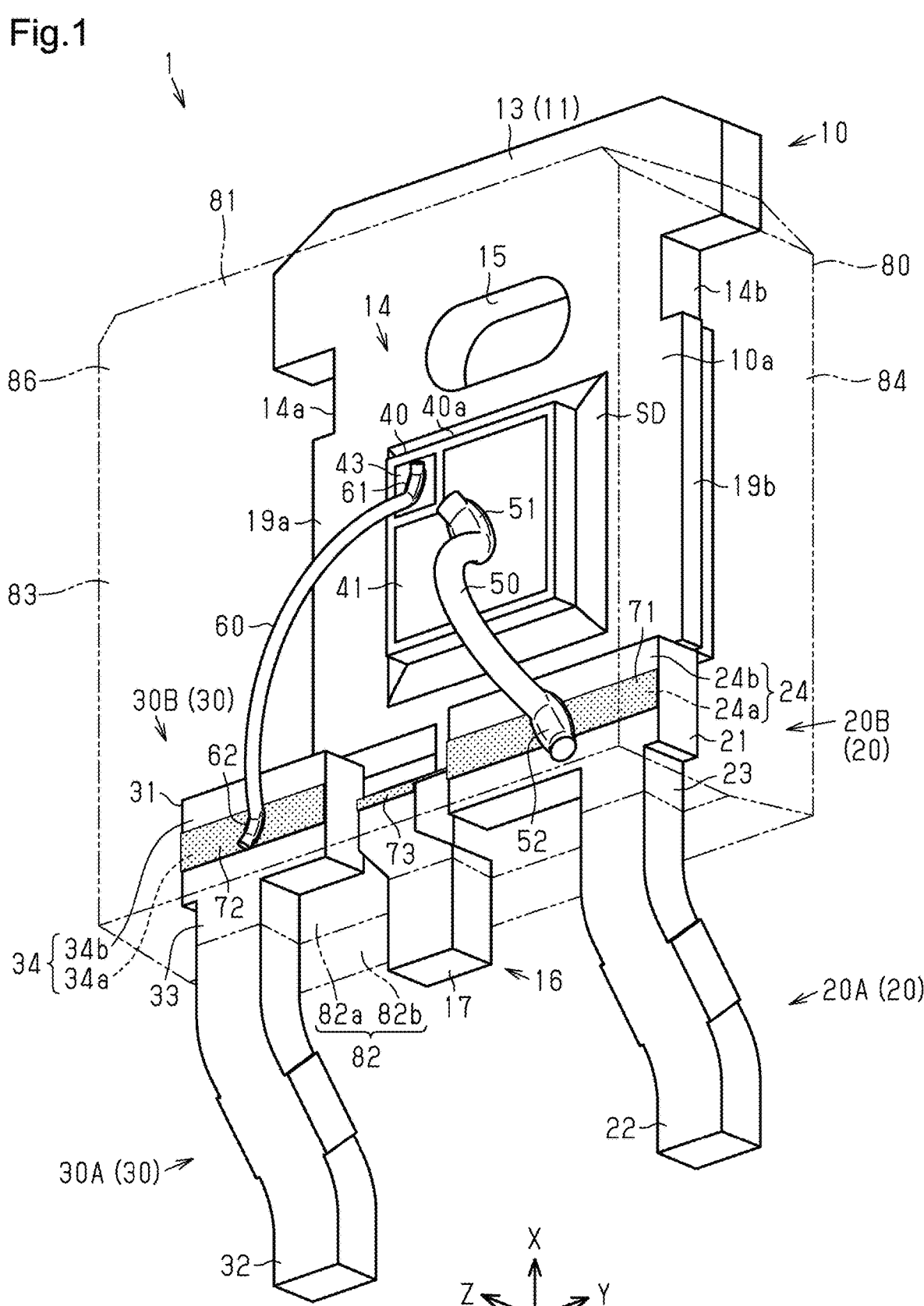
FIG. 1 is a schematic perspective view of a semiconductor device in accordance with a first embodiment.

As shown in FIG. 1, a semiconductor device 1 includes a substrate 10, a drive lead 20, a control lead 30, a semiconductor element 40, a drive wire 50, a control wire 60, and an encapsulation resin 80. The encapsulation resin 80 encapsulates the semiconductor element 40, the control wire 60, and the drive wire 50. The encapsulation resin 80 is formed to expose part of the substrate 10, part of the drive lead 20, and part of the control lead 30.

The drive lead 20 includes an outer lead 20A and an inner lead 20B. The outer lead 20A projects out of the encapsulation resin 80. The inner lead 20B is arranged inside the encapsulation resin 80 and electrically connected to the outer lead 20A. In the present embodiment, the outer lead 20A and the inner lead 20B are integrated into a single component. The control lead 30 includes an outer lead 30A and an inner lead 30B. The outer lead 30A projects out of the encapsulation resin 80. The inner lead 30B is arranged inside the encapsulation resin 80 and electrically connected to the outer lead 30A. In the present embodiment, the outer lead 30A and the inner lead 30B are integrated into a single component. The semiconductor device 1 in the present embodiment is a Transistor Outline (TO)-252 package as specified by the package outline standard (JEITA standards). Further, the semiconductor device 1 is of a single inline package (SIP) type in which the outer lead 20A of the drive lead 20 and the outer lead 30A of the control lead 30 both extend from the same surface of the encapsulation resin 80.

Figure 2:
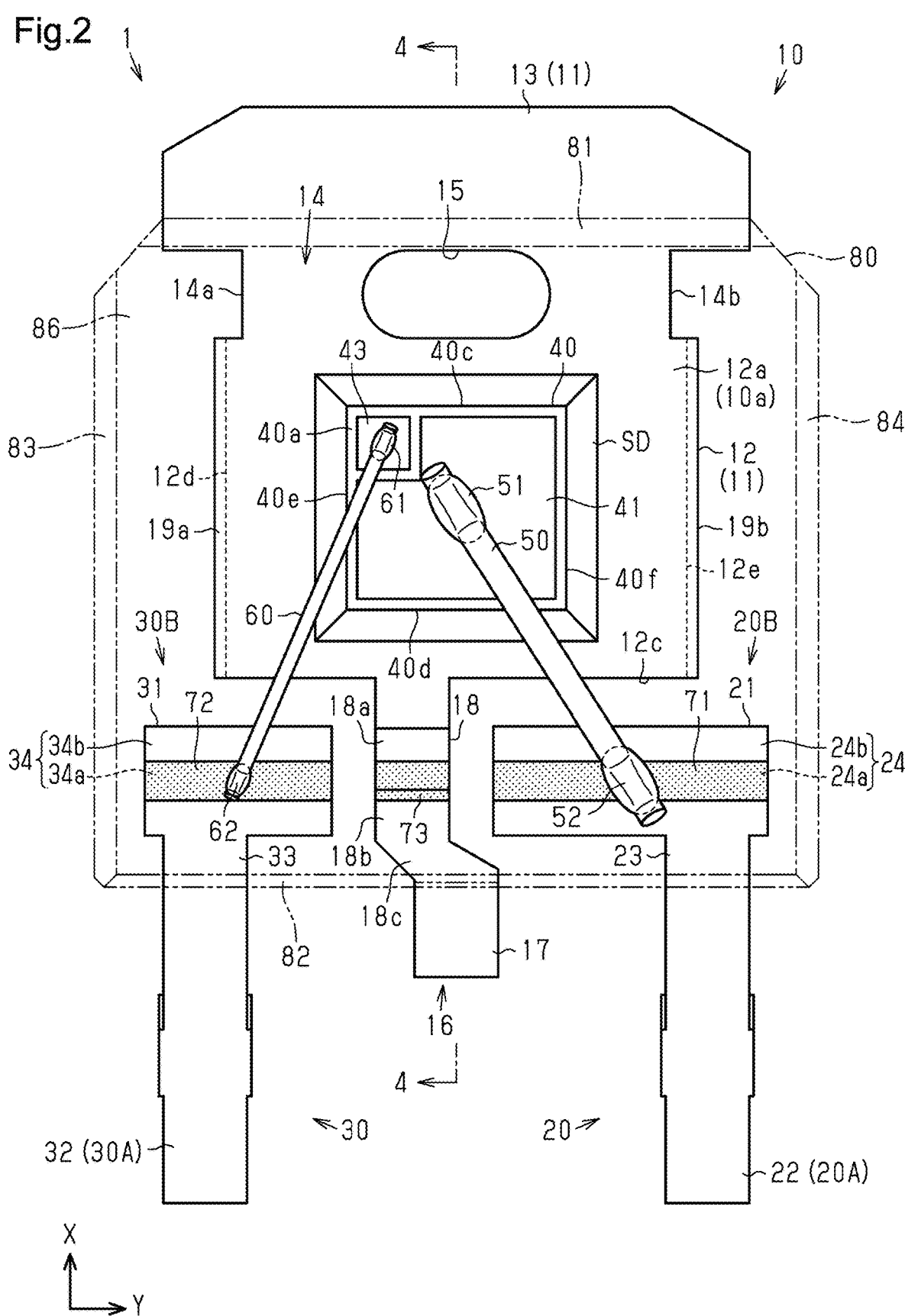
FIG. 2 is a schematic plan view of the semiconductor device in accordance with the first embodiment.
Figure 6:
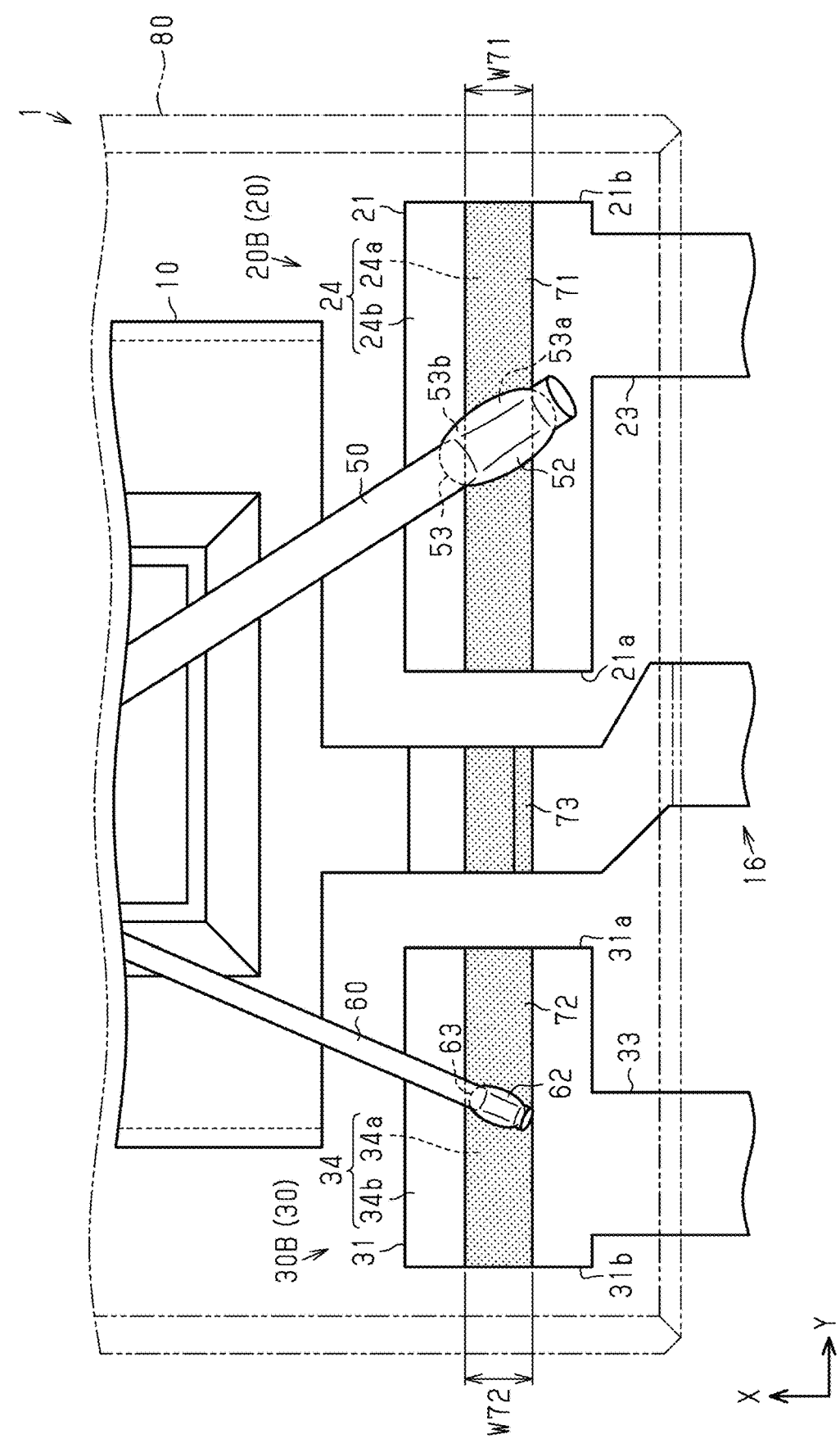
FIG. 6 is a partially enlarged plan view of the semiconductor device in accordance with the first embodiment.

As shown in FIG. 1, the encapsulation resin 80 is box-shaped. In FIGS. 1, 2, and 6, to facilitate understanding, the encapsulation resin 80 is indicated by double-dashed lines, and components located inside the encapsulation resin 80 are indicated by solid lines.

The encapsulation resin 80 is an electrically insulative synthetic resin. In an example, the encapsulation resin 80 is an epoxy resin. The encapsulation resin 80 includes six surfaces, namely, a first encapsulation resin side surface 81, a second encapsulation resin side surface 82, a third encapsulation resin side surface 83, a fourth encapsulation resin side surface 84, an encapsulation resin back surface 85, and an encapsulation resin top surface 86. The first encapsulation resin side surface 81 and the second encapsulation resin side surface 82 are separated and face away from each other. The third encapsulation resin side surface 83 and the fourth encapsulation resin side surface 84 are separated and face away from each other. The encapsulation resin back surface 85 and the encapsulation resin top surface 86 are separated and face away from each other. In the description hereafter, the direction in which the encapsulation resin back surface 85 and the encapsulation resin top surface 86 are arranged next to each other will be referred to as the thickness-wise direction Z, the direction in which the first encapsulation resin side surface 81 and the second encapsulation resin side surface 82 are arranged next to each other will be referred to as the longitudinal direction X, and the direction in which the third encapsulation resin side surface 83 and the fourth encapsulation resin side surface 84 are arranged next to each other will be referred to as the lateral direction Y. The longitudinal direction X and the lateral direction Y are orthogonal to the thickness-wise direction Z. The longitudinal direction X is orthogonal to the lateral direction Y. The thickness-wise direction Z corresponds to a first direction, the longitudinal direction X corresponds to a second direction, and the lateral direction Y corresponds to a third direction.

The encapsulation resin 80 is box-shaped. The encapsulation resin 80 is an electrically insulative synthetic resin. In an example, the encapsulation resin 80 is an epoxy resin.

The encapsulation resin 80 includes six surfaces, namely, a first encapsulation resin side surface 81, a second encapsulation resin side surface 82, a third encapsulation resin side surface 83, a fourth encapsulation resin side surface 84, an encapsulation resin back surface 85, and an encapsulation resin top surface 86. The first encapsulation resin side surface 81 and the second encapsulation resin side surface 82 are separated and face away from each other. The third encapsulation resin side surface 83 and the fourth encapsulation resin side surface 84 are separated and face away from each other. The encapsulation resin back surface 85 and the encapsulation resin top surface 86 are separated and face away from each other. In the description hereafter, the direction in which the encapsulation resin back surface 85 and the encapsulation resin top surface 86 are arranged next to each other will be referred to as the thickness-wise direction Z, the direction in which the first encapsulation resin side surface 81 and the second encapsulation resin side surface 82 are arranged next to each other will be referred to as the longitudinal direction X, and the direction in which the third encapsulation resin side surface 83 and the fourth encapsulation resin side surface 84 are arranged next to each other will be referred to as the lateral direction Y. The longitudinal direction X and the lateral direction Y are orthogonal to the thickness-wise direction Z. The longitudinal direction X is orthogonal to the lateral direction Y. The longitudinal direction X corresponds to the first direction, and the lateral direction Y corresponds to the second direction.

FIG. 2 is a diagram of the semiconductor device 1 as viewed from the encapsulation resin top surface 86 in the thickness-wise direction Z.

As shown in FIG. 2, when the semiconductor device 1 is viewed from the encapsulation resin top surface 86 in the thickness-wise direction Z, the encapsulation resin 80 is substantially rectangular such that the longitudinal direction X is the long-side direction and the lateral direction Y is the short-side direction. A view taken in the thickness-wise direction Z will hereafter be referred to as a plan view. In a plan view, the first encapsulation resin side surface 81 and the second encapsulation resin side surface 82 extend in the lateral direction Y, and the third encapsulation resin side surface 83 and the fourth encapsulation resin side surface 84 extend in the longitudinal direction X.

The substrate 10 includes a main surface 10a and a back surface 10b (refer to FIG. 3) that face away from each other in the thickness-wise direction Z. The main surface 10a is oriented in the same direction as the encapsulation resin top surface 86, and the back surface 10b is oriented in the same direction as the encapsulation resin back surface 85. The substrate 10 is formed of, for example, copper (Cu). In the present embodiment, being formed of Cu means formed from Cu or an alloy including Cu. The substrate 10 includes a plate-shaped substrate body 11 and a lead portion 16. In the present embodiment, the substrate body 11 and the lead portion 16 are integrated into a single component.

The substrate body 11 can be divided into an inner body 12 and a projection 13. The inner body 12 is covered by the encapsulation resin 80. The projection 13 projects out of the encapsulation resin 80. The inner body 12 is arranged next to the projection 13 in the longitudinal direction X. The projection 13 projects out of the first encapsulation resin side surface 81 in the longitudinal direction X. In the present embodiment, the projection 13 is smaller than the inner body 12 in the lateral direction Y. The projection 13 may have any size in the lateral direction Y. In an example, the projection 13 may have the same size as the inner body 12 in the lateral direction Y.

In a plan view, the inner body 12 is arranged so that the center of the inner body 12 with respect to the longitudinal direction X is located toward the first encapsulation resin side surface 81 from the center of the encapsulation resin 80 with respect to the longitudinal direction X. The inner body 12 includes a main surface 12a, a back surface 12b (refer to FIG. 3), a first side surface 12c, a second side surface 12d, and a third side surface 12e. The main surface 12a and the back surface 12b face away from each other in the thickness-wise direction Z. The main surface 12a is part of the main surface 10a of the substrate 10, and the back surface 12b is part of the back surface 10b of the substrate 10. Accordingly, the main surface 12a faces toward the encapsulation resin top surface 86, and the back surface 12b faces toward the encapsulation resin back surface 85. Further, the first side surface 12c faces toward the second encapsulation resin side surface 82, the second side surface 12d faces toward the third encapsulation resin side surface 83, and the third side surface 12e faces toward the fourth encapsulation resin side surface 84. The first side surface 12c extends in the lateral direction Y. The second side surface 12d is separated from and opposite to the third side surface 12e in the lateral direction Y The second side surface 12d and the third side surface 12e extend in the longitudinal direction X.

The inner body 12 includes a narrow portion 14 at an end located toward the projection 13. The narrow portion 14 includes a recess 14a and a recess 14b. The recess 14a is recessed from the second side surface 12d toward the fourth encapsulation resin side surface 84 in the lateral direction Y, and the recess 14b is recessed from the third side surface 12e toward the third encapsulation resin side surface 83 in the lateral direction Y. The narrow portion 14 is smaller in size in the lateral direction Y than the part of the inner body 12 that does not correspond to the narrow portion 14. Further, the narrow portion 14 is smaller in size in the lateral direction Y than the projection 13. The narrow portion 14 is arranged next to the first encapsulation resin side surface 81 of the encapsulation resin 80 in the longitudinal direction X. The narrow portion 14 includes a through hole 15 that extends through the narrow portion 14 in the thickness-wise direction Z. In a plan view, the through hole 15 is elliptic with the lateral direction Y corresponding to the longitudinal direction.

The inner body 12 includes flanges 19a and 19b that extend from the side surfaces of the inner body 12. The flange 19a projects from the second side surface 12d of the inner body 12 toward the third encapsulation resin side surface 83. The flange 19b projects from the third side surface 12e of the inner body 12 toward the fourth encapsulation resin side surface 84.

The flanges 19a and 19b are both arranged to be flush with the main surface 12a of the inner body 12. Thus, the main surface 10a of the substrate 10 includes the main surface 12a and the flanges 19a and 19b of the inner body 12. Further, the flanges 19a and 19b are located toward the main surface 12a of the inner body 12 from the back surface 12b. Thus, the back surface 10b of the substrate 10 includes the back surface 12b of the inner body 12. The flanges 19a and 19b hinder separation of the substrate 10 from the encapsulation resin 80.

Figure 3:
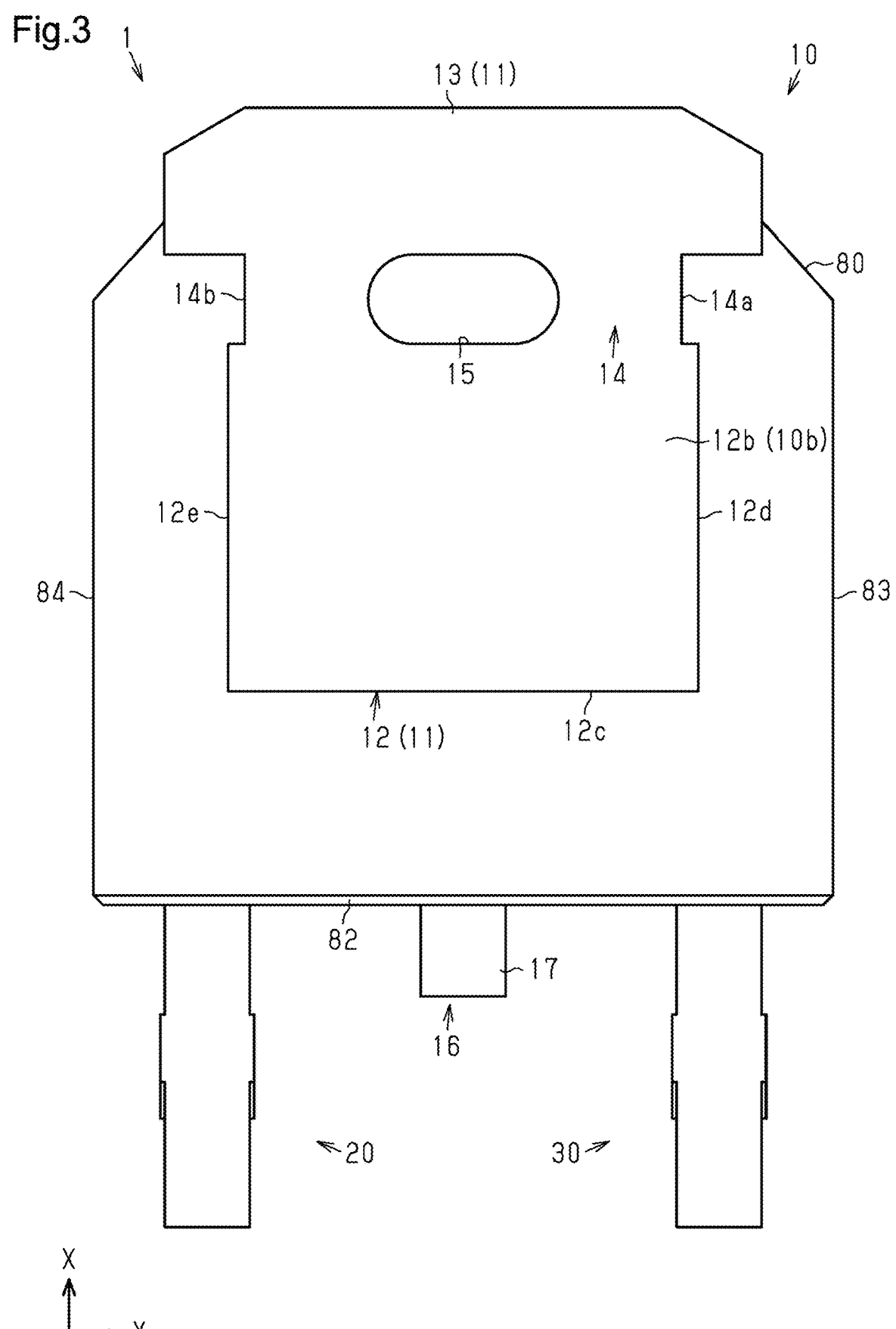
FIG. 3 is a schematic rear view of the semiconductor device in accordance with the first embodiment.

As shown in FIG. 3, the back surface 10b of the substrate 10 (back surface 12b of inner body 12) is exposed from the encapsulation resin back surface 85. This dissipates heat of the substrate 10 out of the semiconductor device 1. The encapsulation resin 80 fills the recesses 14a and 14b and the through hole 15 in the narrow portion 14 of the inner body 12. This further hinders separation of the substrate 10 from the encapsulation resin 80.

Figure 4:
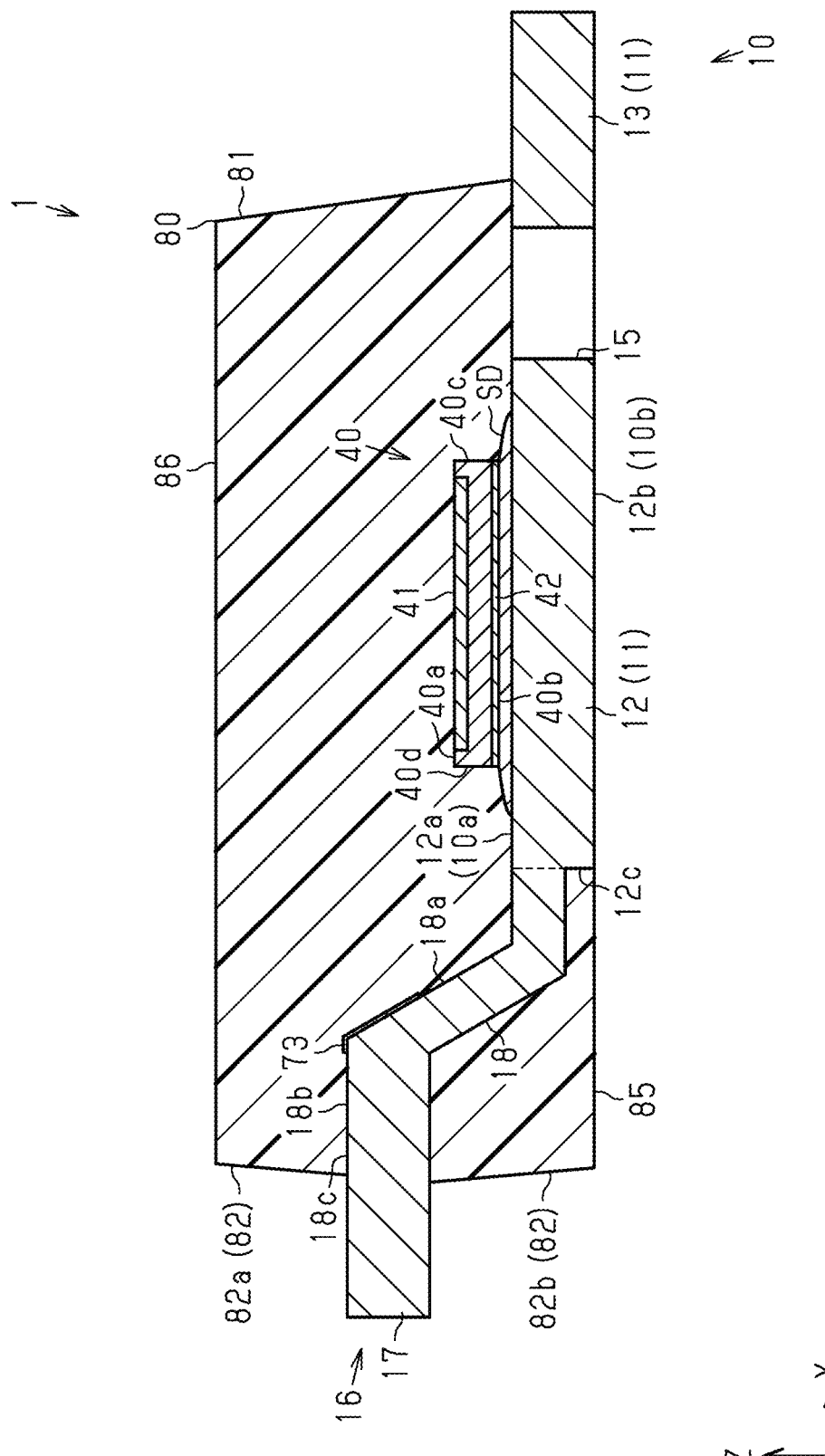
FIG. 4 is a cross-sectional view taken along line 4-4 in FIG. 2.

As shown in FIGS. 2 and 4, the lead portion 16 extends from the end of the inner body 12 located at the side of the first side surface 12c toward the second encapsulation resin side surface 82 and projects out of the second encapsulation resin side surface 82. The lead portion 16 can be divided into a terminal section 17 and a coupling section 18. The terminal section 17 projects out of the second encapsulation resin side surface 82. The coupling section 18 couples the terminal section 17 and the inner body 12.

As shown in FIG. 2, the coupling section 18 is located toward the second side surface 12d from the central part of the inner body 12 in the lateral direction Y. The coupling section 18 is continuous with the flange 19a. Specifically, the coupling section 18 includes a part connected to the inner body 12, and the part is thicker than the flanges 19a and 19b and thinner than the inner body 12.

As shown in FIGS. 2 and 4, the coupling section 18 includes an inclined part 18a. The inclined part 18a is inclined from the first side surface 12c of the inner body 12 so that the encapsulation resin top surface 86 becomes closer as the second encapsulation resin side surface 82 becomes closer. The coupling section 18 includes a middle part 18b located between the inclined part 18a and the terminal section 17. The middle part 18b is located toward the encapsulation resin top surface 86 from the main surface 12a of the inner body 12. In a plan view, the middle part 18b includes a bent 18c that is bent toward the fourth encapsulation resin side surface 84. The portion of the second encapsulation resin side surface 82 where the middle part 18b intersects is located at the central part of the second encapsulation resin side surface 82 with respect to the lateral direction Y.

The terminal section 17 projects out of the central part of the second encapsulation resin side surface 82 with respect to the lateral direction Y. With respect to the thickness-wise direction Z, the terminal section 17 is located at the same position as the middle part 18b. In other words, the terminal section 17 is located toward the encapsulation resin top surface 86 from the main surface 12a of the inner body 12.

As shown in FIG. 2, in a plan view, the drive lead 20 and the control lead 30 are separated from the substrate 10 in the longitudinal direction X and located toward the second encapsulation resin side surface 82 of the encapsulation resin 80 from the substrate 10. The drive lead 20 is separated from the control lead 30 in the lateral direction Y. The lead portion 16 is located between the drive lead 20 and the control lead 30 in the lateral direction Y.

The drive lead 20 includes a drive pad 21, a drive terminal 22, and a coupling portion 23. The drive pad 21 and the coupling portion 23 define the inner lead 20B, and the drive terminal 22 defines the outer lead 20A. The coupling portion 23 couples the drive pad 21 and the drive terminal 22. The drive pad 21 and the coupling portion 23 are located between the substrate 10 and the second encapsulation resin side surface 82 in the longitudinal direction X. The drive pad 21 and the coupling portion 23 are located toward the fourth encapsulation resin side surface 84 from the central part of the encapsulation resin 80 with respect to the lateral direction Y. In the present embodiment, the drive lead 20 is formed of Cu. That is, the drive lead 20 is formed from the same material as the substrate 10.

Figure 5:
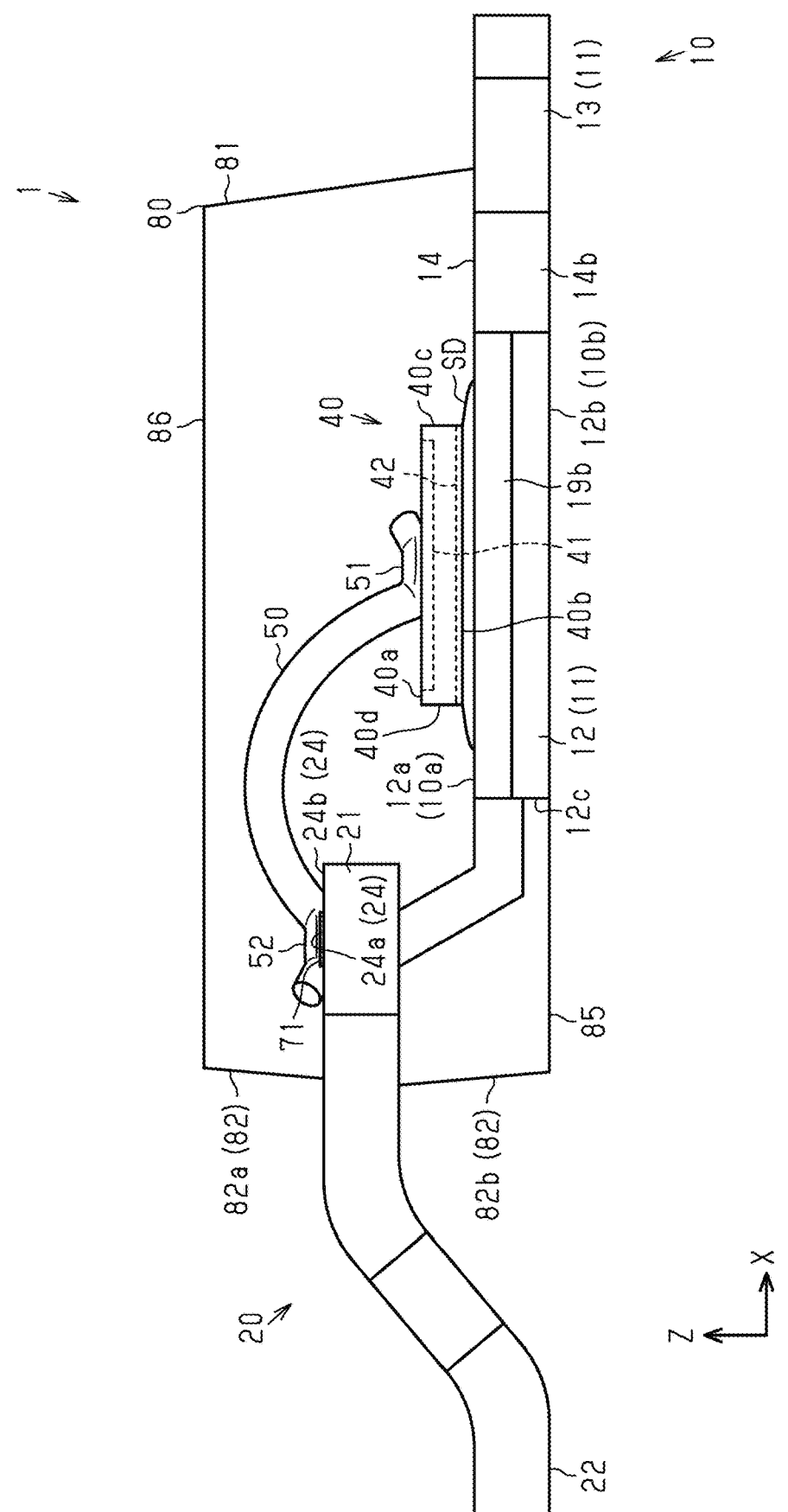
FIG. 5 is a schematic side view of the semiconductor device in accordance with the first embodiment.

In a plan view, the drive pad 21 is rectangular with the lateral direction Y corresponding to the long-side direction and the longitudinal direction X corresponding to the short-side direction. The drive pad 21 includes a first end portion 21a and a second end portion 21b in the lateral direction Y. As shown in FIG. 5, the drive pad 21 is located toward the encapsulation resin top surface 86 from the main surface 12a of the inner body 12 in the thickness-wise direction Z. Further, the drive pad 21 is located toward the encapsulation resin top surface 86 from a main surface 40a of the semiconductor element 40 in the thickness-wise direction Z. As shown in FIGS. 4 and 5, in the present embodiment, the drive pad 21 is located at the same position as the middle part 18b of the lead portion 16 with respect to the thickness-wise direction Z.

As shown in FIG. 2, the coupling portion 23 is continuous with the end of the drive pad 21 located at the side of the second encapsulation resin side surface 82. The coupling portion 23 is located toward the fourth encapsulation resin side surface 84 from the central part of the drive pad 21 with respect to the lateral direction Y. The drive terminal 22 forms a source terminal. As shown in FIG. 5, the drive terminal 22 projects out of a first inclined surface 82a of the second encapsulation resin side surface 82.

As shown in FIG. 2, the control lead 30 includes a control pad 31, a control terminal 32, and a coupling portion 33. The control pad 31 and the coupling portion 33 define the inner lead 30B. The control terminal 32 defines the outer lead 30A. The coupling portion 33 couples the control pad 31 and the control terminal 32. The control pad 31 and the coupling portion 33 are located between the substrate 10 and the second encapsulation resin side surface 82 in the longitudinal direction X. The control pad 31 and the coupling portion 33 are located toward the third encapsulation resin side surface 83 from the central part of the encapsulation resin 80 in the lateral direction Y. In the present embodiment, the control lead 30 is formed of Cu. That is, the control lead 30 is formed from the same material as the substrate 10 and the drive lead 20.

In a plan view, the control pad 31 is rectangular with the lateral direction Y corresponding to the long-side direction and the longitudinal direction X corresponding to the short-side direction. The control pad 31 includes a first end portion 31a and a second end portion 31b in the lateral direction Y. The control pad 31 is smaller than the drive pad 21 in the lateral direction Y. In the thickness-wise direction Z, the control pad 31 is located toward the encapsulation resin top surface 86 from the main surface 12a of the inner body 12. Further, the control pad 31 is located toward the encapsulation resin top surface 86 from the main surface 40a of the semiconductor element 40 in the thickness-wise direction Z. In the present embodiment, the control pad 31 is located at the same position as the middle part 18b of the lead portion 16 with respect to the thickness-wise direction Z.

The coupling portion 33 is continuous with the end of the control pad 31 located at the side of the second encapsulation resin side surface 82. The coupling portion 33 is located on the control pad 31 toward the third encapsulation resin side surface 83 in the lateral direction Y. The control terminal 32 forms a gate terminal. The control terminal 32 projects out of the first inclined surface 82a of the second encapsulation resin side surface 82.

The drive pad 21 includes a connection surface 24 that is oriented in the same direction as the main surface 10a of the substrate 10. A plated layer 71 that partially covers the connection surface 24 is formed on the connection surface 24. The plated layer 71 is formed of, for example, nickel (Ni). Being formed of Ni means formed from Ni or an alloy including Ni. The plated layer 71 is formed on the central portion of the drive pad 21 with respect to the short-side direction of the drive pad 21, or the longitudinal direction X. Further, the plated layer 71 extends from the first end portion 21a to the second end portion 21b of the drive pad 21 in the long-side direction of the drive pad 21, or the lateral direction Y. Therefore, the connection surface 24 of the drive pad 21 includes a region 24a that is covered by the plated layer 71 and a region 24b that is exposed from the plated layer 71.

The control pad 31 includes a connection surface 34 that is oriented in the same direction as the main surface 10a of the substrate 10. A plated layer 72 that partially covers the connection surface 34 is formed on the connection surface 34. The plated layer 72 is formed of, for example, Ni. Being formed of Ni means formed from Ni or an alloy including Ni. The plated layer 72 is formed on the central portion of the control pad 31 with respect to the short-side direction of the control pad 31, or the longitudinal direction X. Further, the plated layer 72 extends from the first end portion 31a to the second end portion 31b of the control pad 31 in the long-side direction of the control pad 31, or the lateral direction Y. Therefore, the connection surface 34 of the control pad 31 includes a region 34a that is covered by the plated layer 72 and a region 34b that is exposed from the plated layer 72.

In the present embodiment, the plated layer 71 formed on the drive pad 21 and the plated layer 72 formed on the control pad 31 are located at the same position with respect to the longitudinal direction X. Further, in the longitudinal direction X, width W71 of the plated layer 71 formed on the drive pad 21 is the same as width W72 of the plated layer 72 formed on the control pad 31. Therefore, the plated layer 71, which is formed on the drive pad 21, is overlapped with the plated layer 72, which is formed on the control pad 31, as viewed in the lateral direction Y.

In the present embodiment, the end of the middle part 18b of the lead portion 16 at the side of the inclined part 18a is located at the same height as the drive pad 21 and the control pad 31. In the present embodiment, for example, a plated layer 73 is formed on an upper surface of the middle part 18b and is overlapped with the plated layers 71 and 72 as viewed in the lateral direction Y.

As shown in FIGS. 4 and 5, the semiconductor element 40 is mounted on the main surface 12a of the inner body 12 by solder SD. As shown in FIG. 2, in the present embodiment, the semiconductor element 40 is located at the central part of the inner body 12. Further, the semiconductor element 40 and the drive pad 21 are arranged at different positions as viewed in the longitudinal direction X. Further, the semiconductor element 40 and the control pad 31 are arranged at different positions as viewed in the longitudinal direction X.

The semiconductor element 40 is a silicon carbide (SiC) chip. In the present embodiment, the semiconductor element 40 uses a metal-oxide-semiconductor field-effect transistor (SiCMOSFET). The semiconductor element 40 (SiCMOS-FET) is an element that allows for high-speed switching. The switching frequency is, for example, one kHz or greater and several hundred kHz or less.

The semiconductor element 40 has the shape of a plate. Specifically, the semiconductor element 40 is, for example, square in a plan view. As shown in FIGS. 2 and 4, the semiconductor element 40 includes the main surface 40a, a back surface 40b, and side surfaces 40c to 40f. The main surface 40a and the back surface 40b are faced away from each other in the thickness-wise direction Z. The main surface 40a faces toward the encapsulation resin top surface 86. That is, the main surface 40a is oriented in the same direction as the main surface 10a of the substrate 10. The back surface 40b faces toward the encapsulation resin back surface 85. The back surface 40b is opposite to the main surface 12a of the inner body 12. The side surface 40c faces toward the first encapsulation resin side surface 81, the side surface 48d faces toward the second encapsulation resin side surface 82, the side surface 40e faces toward the third encapsulation resin side surface 83, and the side surface 40f faces toward the fourth encapsulation resin side surface 84.

A main surface drive electrode 41 and a control electrode 43 are formed on the main surface 40a. The main surface drive electrode 41 and the control electrode 43 define a main surface electrode formed on the main surface 40a of the semiconductor element 40. A back surface drive electrode 42 (refer to FIG. 4) is formed on the back surface 40b. In the present embodiment, the main surface drive electrode 41 forms a source electrode, and the back surface drive electrode 42 forms a drain electrode. The control electrode 43 forms a gate electrode. The back surface drive electrode 42 is electrically connected to the inner body 12 by the solder SD. The solder SD is, for example, lead solder.

The semiconductor element 40 includes a passivation film formed on the main surface 40a. The passivation film includes openings that expose the electrode at the side of the main surface 40a of the semiconductor element 40 as the main surface drive electrode 41 and the control electrode 43.

As shown in FIGS. 1 and 2, the semiconductor device 1 includes a single drive wire 50 and a single control wire 60.

In the present embodiment, the drive wire 50 and the control wire 60 are formed of the same metal. In the present embodiment, the drive wire 50 and the control wire 60 are formed of aluminum (Al). Being formed of Al means formed from Al or an alloy including Al.

The central part of the drive wire 50 has a circular cross section taken in a direction perpendicular to the longitudinal direction of the drive wire 50. The central part of the control wire 60 has a circular cross section taken in a direction perpendicular to the longitudinal direction of the control wire 60. The diameter of the drive wire 50 is greater than that of the control wire 60. In other words, the drive wire 50 is a large-diameter aluminum wire. The diameter of the drive wire 50 is, for example, 200 μm or greater and 600 μm or less. The diameter of the control wire 60 is, for example, 40 μm or greater and 100 μm or less.

The drive wire 50 includes a first end 51 and a second end 52. The first end 51 is bonded to the main surface drive electrode 41 of the semiconductor element 40. The second end 52 is bonded to the plated layer 71, which partially covers the connection surface 24 of the drive pad 21. The drive wire 50 is bonded through, for example, ultrasonic bonding to the main surface drive electrode 41 and the drive pad 21. In the present embodiment, the drive wire 50 includes a bonding portion 53 at the second end 52. The bonding portion 53 includes a region 53a and a region 53b. The region 53a is bonded to the upper surface of the plated layer 71. The region 53b is bonded to the region 24b of the connection surface 24 of the drive pad 21, which is exposed from the plated layer 71. As shown in FIG. 6, the area of the region 53a on the upper surface of the plated layer 71, where the second end 52 of the drive wire 50 is bonded to the plated layer 71, is greater than or equal to the area of the cross section of the drive wire 50 that is taken in a direction perpendicular to the longitudinal direction of the drive wire 50. In other words, the width W71 of the plated layer 71 in the longitudinal direction X is set so that the bonding area between the drive wire 50 and the plated layer 71 is greater than or equal to the cross-sectional area of the drive wire 50.

The present embodiment is an example in which the bonding portion 53 includes the region 53a and the region 53b. Instead, the width W71 of the plated layer 71 may be set so that the bonding portion 53 is entirely bonded with the plated layer 71.

As shown in FIGS. 1 and 2, the control wire 60 includes a first end 61 and a second end 62. The first end 61 is bonded to the control electrode 43 of the semiconductor element 40. The second end 62 is bonded to the plated layer 72, which partially covers the connection surface 34 of the control pad 31. The control wire 60 is bonded through, for example, ultrasonic bonding to the control electrode 43 and the control pad 31. As shown in FIG. 6, in the present embodiment, the control wire 60 includes a bonding portion 63 at the second end 62 that is bonded to only the upper surface of the plated layer 72. In other words, the width W72 of the plated layer 72 in the longitudinal direction X is set so that the bonding portion 63 at the second end 62 of the control wire 60 does not extend beyond the width W72.

Operation

The operation of the present embodiment will now be described.

In the semiconductor device 1 of the present embodiment, the semiconductor element 40 is mounted on the main surface 10a of the substrate 10. Further, the plated layers 71 and 72, which are formed of Ni, are respectively formed on the connection surface 24 of the drive pad 21 and the connection surface 34 of the control pad 31, which are formed of Cu, to partially cover the connection surfaces 24 and 34. The first end 51 of the drive wire 50, which is formed of Al, is bonded to the main surface drive electrode 41 of the semiconductor element 40. The second end 52 of the drive wire 50, which is formed of Al, is bonded to the plated layer 71 on the connection surface 24 of the drive pad 21. The first end 61 of the control wire 60, which is formed of Al, is bonded to the control electrode 43 of the semiconductor element 40. The second end 62 of the control wire 60, which is formed of Al, is bonded to the plated layer 72 on the connection surface 34 of the control pad 31. The encapsulation resin 80 encapsulates the semiconductor element 40, the drive pad 21, the control pad 31, the plated layers 71 and 72, the drive wire 50, and the control wire 60.

The connection surface 24 of the drive pad 21 includes the region 24a, which is covered by the plated layer 71, and the region 24b, which is exposed from the plated layer 71. The plated layer 71, which is formed of Ni, hinders separation of the drive wire 50 from the drive pad 21. If the drive wire 50, which is formed of Al, is directly bonded to the drive pad 21, which is formed of Cu, for example, heat may advance the growth of an intermetallic compound between the drive wire 50 and the drive pad 21 and separate the drive wire 50 from the drive pad 21. Thus, the plated layer 71, which is formed of Ni, prevents the formation of an intermetallic compound and hinders separation of the drive wire 50 from the drive pad 21.

The region 24b in the connection surface 24 of the drive pad 21 exposed from the plated layer 71 is the surface of the drive pad 21 that is formed of Cu and readily adhered with the encapsulation resin 80. In this manner, the region 24b avoids delamination of the encapsulation resin 80 from the drive pad 21. Delamination of the encapsulation resin 80 from the drive pad 21 may break the drive wire 50, which is bonded to the drive pad 21. In this respect, the region 24b exposed from the plated layer 71 hinders delamination of the encapsulation resin 80 from the drive pad 21 and avoids breakage of the drive wire 50.

The connection surface 34 of the control pad 31 includes the region 34a, which is covered by the plated layer 72, and the region 34b, which is exposed from the plated layer 72. The plated layer 72, which is formed of Ni, hinders separation of the control wire 60 from the control pad 31. If the control wire 60, which is formed of Al, is directly bonded to the control pad 31, which is formed of Cu, for example, heat may advance the growth of an intermetallic compound between the control wire 60 and the control pad 31 and separate the control wire 60 from the control pad 31. Thus, the plated layer 72, which is formed of Ni, prevents the formation of an intermetallic compound and hinders separation of the control wire 60 from the control pad 31.

The region 34b in the connection surface 34 of the control pad 31 exposed from the plated layer 72 is the surface of the control pad 31 that is formed of Cu and readily adhered with the encapsulation resin 80. In this manner, the region 34b avoids delamination of the encapsulation resin 80 from the control pad 31. Delamination of the encapsulation resin 80 from the control pad 31 may break the control wire 60, which is bonded to the control pad 31. In this respect, the region 34b exposed from the plated layer 72 hinders delamination of the encapsulation resin 80 from the control pad 31 and avoids breakage of the control wire 60.

Large currents flow to the semiconductor device 1 including the semiconductor element 40 formed of SiC. Thus, the large-diameter drive wire 50, which is formed of Al, is used between the main surface drive electrode 41 of the semiconductor element 40 and the drive pad 21. If a gold (Au) or Cu wire were to be used, multiple wires would need to be connected in accordance with the current. This would increase the number of processes required for connection and enlarge the pad area thereby increasing the size of the semiconductor device. In the semiconductor device 1 of the present embodiment, the single drive wire 50 allows for the flow of the necessary current without increasing manufacturing processes or increasing the size of the semiconductor device.

The semiconductor device 1 in the present embodiment has the following advantages.

(1) The semiconductor element 40 is mounted on the main surface 10a of the substrate 10. The plated layers 71 and 72, which are formed of Ni, are respectively formed on the connection surface 24 of the drive pad 21 and the connection surface 34 of the control pad 31, which are formed of Cu, to partially cover the connection surfaces 24 and 34. The first end 51 of the drive wire 50, which is formed of Al, is bonded to the main surface drive electrode 41 of the semiconductor element 40, and the second end 52 of the drive wire 50 is bonded to the plated layer 71 on the connection surface 24 of the drive pad 21. The first end 61 of the control wire 60, which is formed of Al, is bonded to the control electrode 43 of the semiconductor element 40, and the second end 62 of the control wire 60 is bonded to the plated layer 72 on the connection surface 34 of the control pad 31. The encapsulation resin 80 encapsulates the semiconductor element 40, the drive pad 21, the control pad 31, the plated layers 71 and 72, the drive wire 50, and the control wire 60. The plated layer 72 formed of Ni hinders separation of the control wire 60 from the control pad 31. The region 24b in the connection surface 24 of the drive pad 21 that is exposed from the plated layer 71 is readily adhered to the encapsulation resin 80. This hinders delamination of the encapsulation resin 80 from the drive pad 21 and avoids breakage of the drive wire 50. Further, the plated layer 71 formed of Ni hinders separation of the drive wire 50 from the drive pad 21. The region 24b on the connection surface 34 of the drive pad 21 is exposed from the plated layer 71 and is suitably adhesive to the encapsulation resin 80. This avoids falling of the encapsulation resin 80 from the drive pad 21 and breakage of the drive wire 50.

Second Embodiment

A semiconductor device of a second embodiment will now be described with reference to FIGS. 9 to 14.

Figure 9:
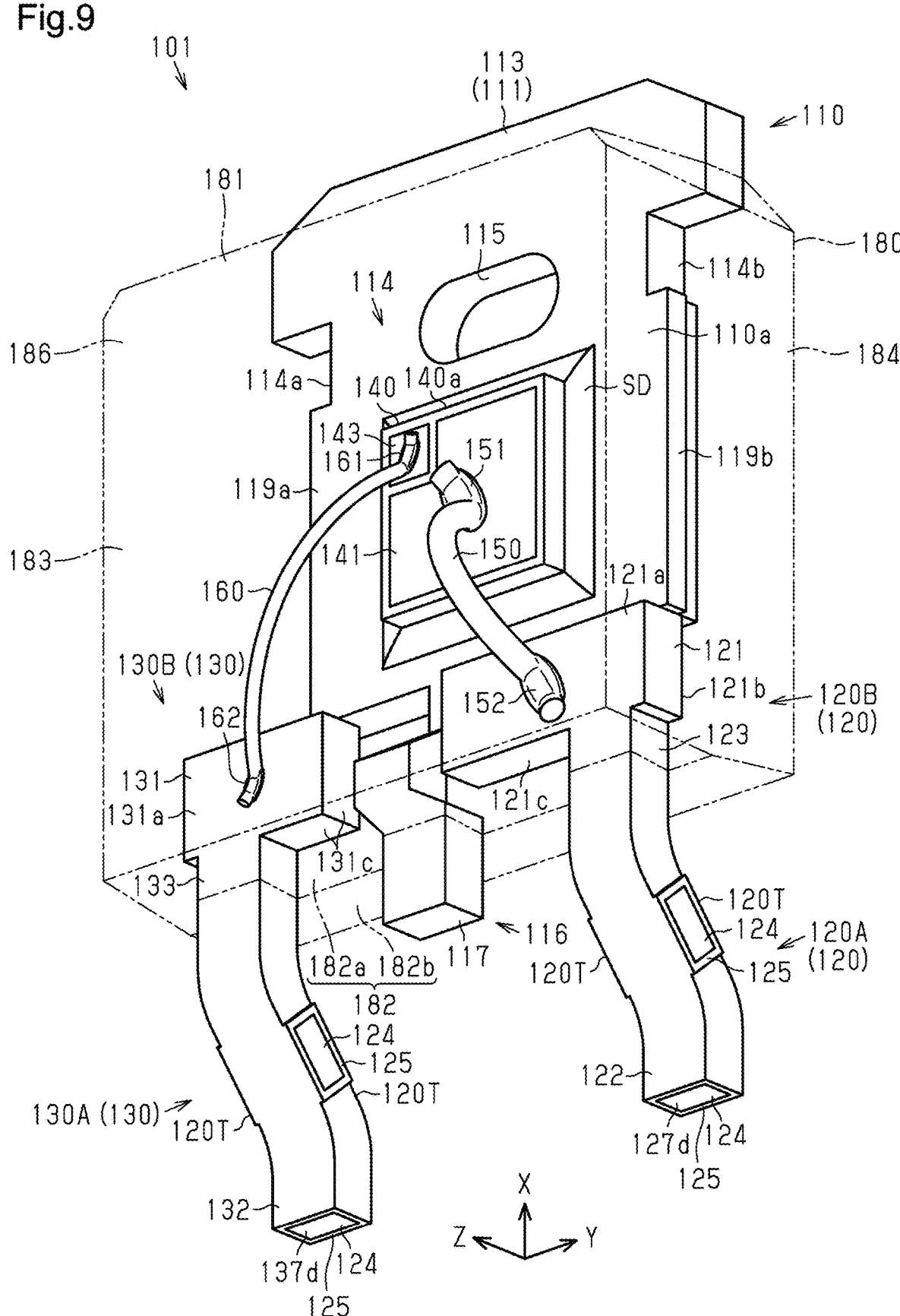
FIG. 9 is a schematic perspective view of a semiconductor device in accordance with a second embodiment.

As shown in FIG. 9, a semiconductor device 101 includes a substrate 110, a drive lead 120, a control lead 130, a semiconductor element 140, a drive wire 150, a control wire 160, and an encapsulation resin 180. The encapsulation resin 180 encapsulates the semiconductor element 140, the control wire 160, and the drive wire 150. The encapsulation resin 180 is formed to expose part of the substrate 110, part of the drive lead 120, and part of the control lead 130.

The drive lead 120 includes an outer lead 120A and an inner lead 120B. The outer lead 120A projects out of the encapsulation resin 180. The inner lead 120B is arranged inside the encapsulation resin 180 and electrically connected to the outer lead 120A. In the present embodiment, the outer lead 120A and the inner lead 120B are integrated into a single component. The control lead 130 includes an outer lead 130A and an inner lead 130B. The outer lead 130A projects out of the encapsulation resin 180. The inner lead 130B is arranged inside the encapsulation resin 180 and electrically connected to the outer lead 130A. In the present embodiment, the outer lead 130A and the inner lead 130B are integrated into a single component. The semiconductor device 101 in the present embodiment is a Transistor Outline (TO)-252 package specified by the package outline standard (JEITA standards). Further, the semiconductor device 101 is of a single inline package (SIP) type in which the outer lead 120A of the drive lead 120 and the outer lead 130A of the control lead 130 both extend from the same surface of the encapsulation resin 180.

Figure 10:
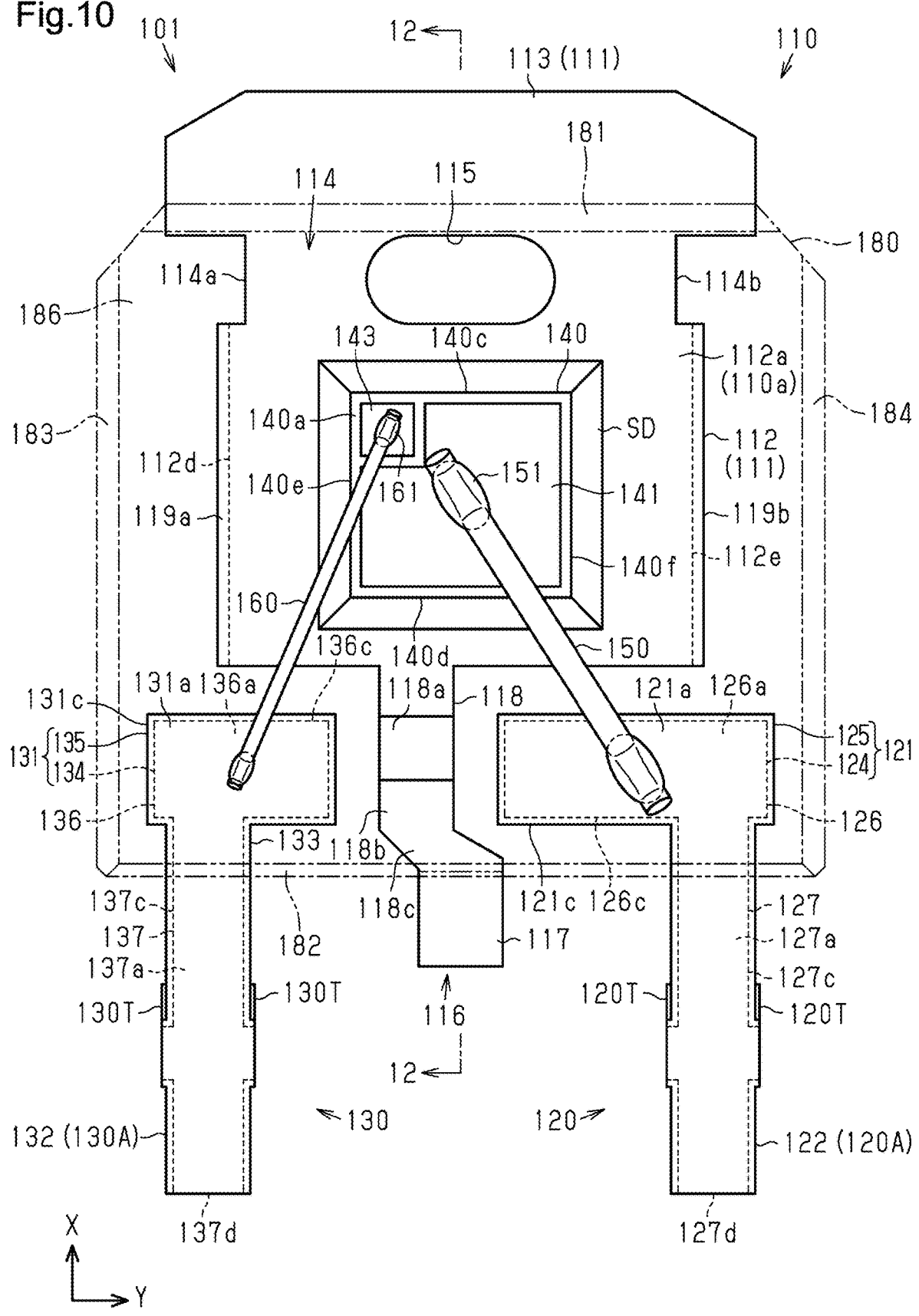
FIG. 10 is a schematic plan view of the semiconductor device in accordance with the second embodiment.
Figure 14:
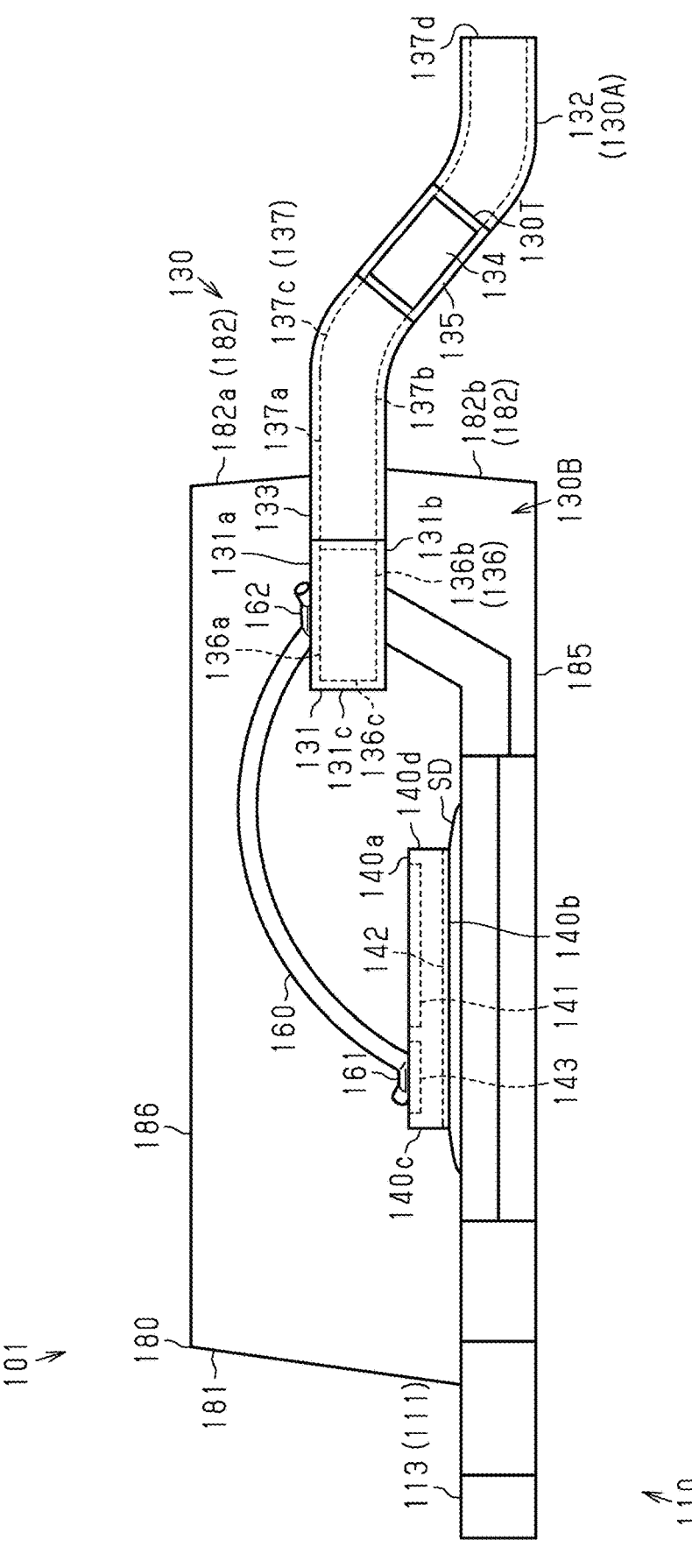
FIG. 14 is a schematic side view of the semiconductor device in accordance with the second embodiment.

As shown in FIG. 9, the encapsulation resin 180 is box-shaped. In FIGS. 9, 10, and 14, to facilitate understanding, the encapsulation resin 180 is indicated by double-dashed lines and components located inside the encapsulation resin 180 are indicated by solid lines.

The encapsulation resin 180 is an electrically insulative synthetic resin. In an example, the encapsulation resin 180 is an epoxy resin. The encapsulation resin 180 includes six surfaces, namely, a first encapsulation resin side surface 181, a second encapsulation resin side surface 182, a third encapsulation resin side surface 83, a fourth encapsulation resin side surface 184, an encapsulation resin back surface 185, and an encapsulation resin top surface 186. The first encapsulation resin side surface 181 and the second encapsulation resin side surface 182 are separated and face away from each other. The third encapsulation resin side surface 83 and the fourth encapsulation resin side surface 184 are separated and face away from each other. The encapsulation resin back surface 185 and the encapsulation resin top surface 186 are separated and face away from each other. In the description hereafter, the direction in which the encapsulation resin back surface 185 and the encapsulation resin top surface 186 are arranged next to each other will be referred to as the thickness-wise direction Z, the direction in which the first encapsulation resin side surface 181 and the second encapsulation resin side surface 182 are arranged next to each other will be referred to as the longitudinal direction X, and the direction in which the third encapsulation resin side surface 83 and the fourth encapsulation resin side surface 184 are arranged next to each other will be referred to as the lateral direction Y. The longitudinal direction X and the lateral direction Y are orthogonal to the thickness-wise direction Z. The longitudinal direction X is orthogonal to the lateral direction Y. The thickness-wise direction Z corresponds to a first direction, the longitudinal direction X corresponds to a second direction, and the lateral direction Y corresponds to a third direction.

The encapsulation resin 180 is box-shaped. The encapsulation resin 180 is an electrically insulative synthetic resin. In an example, the encapsulation resin 180 is an epoxy resin. The encapsulation resin 180 includes six surfaces, namely, a first encapsulation resin side surface 181, a second encapsulation resin side surface 182, a third encapsulation resin side surface 83, a fourth encapsulation resin side surface 184, an encapsulation resin back surface 185, and an encapsulation resin top surface 186. The first encapsulation resin side surface 181 and the second encapsulation resin side surface 182 are separated and face away from each other. The third encapsulation resin side surface 83 and the fourth encapsulation resin side surface 184 are separated and face away from each other. The encapsulation resin back surface 185 and the encapsulation resin top surface 186 are separated and face away from each other. In the description hereafter, the direction in which the encapsulation resin back surface 185 and the encapsulation resin top surface 186 are arranged next to each other will be referred to as the thickness-wise direction Z, the direction in which the first encapsulation resin side surface 181 and the second encapsulation resin side surface 182 are arranged next to each other will be referred to as the longitudinal direction X, and the direction in which the third encapsulation resin side surface 83 and the fourth encapsulation resin side surface 184 are arranged next to each other will be referred to as the lateral direction Y. The longitudinal direction X and the lateral direction Y are orthogonal to the thickness-wise direction Z. The longitudinal direction X is orthogonal to the lateral direction Y. The longitudinal direction X corresponds to the first direction, and the lateral direction Y corresponds to the second direction.

FIG. 10 is a diagram of the semiconductor device 101 as viewed from the encapsulation resin top surface 186 in the thickness-wise direction Z.

As shown in FIG. 10, when the semiconductor device 101 is viewed from the encapsulation resin top surface 186 in the thickness-wise direction Z, the encapsulation resin 180 is substantially rectangular such that the longitudinal direction X is the long-side direction and the lateral direction Y is the short-side direction. A view taken in the thickness-wise direction Z will hereafter be referred to as a plan view. In a plan view, the first encapsulation resin side surface 181 and the second encapsulation resin side surface 182 extend in the lateral direction Y, and the third encapsulation resin side surface 83 and the fourth encapsulation resin side surface 184 extend in the longitudinal direction X.

The substrate 110 includes a main surface 110a and a back surface 110b (refer to FIG. 11) that are faced away from each other in the thickness-wise direction Z. The main surface 110a is oriented in the same direction as the encapsulation resin top surface 186. The back surface 110b is oriented in the same direction as the encapsulation resin back surface 185. The substrate 110 includes a plate-shaped substrate body 111 and a lead portion 116. In the present embodiment, the substrate body 111 and the lead portion 116 are integrated into a single component. The substrate body 111 is a die bonding pad on which the semiconductor element 140 is mounted.

The substrate body 111 can be divided into an inner body 112 and a projection 113. The inner body 112 is covered by the encapsulation resin 180. The projection 113 projects out of the encapsulation resin 180. The inner body 112 is arranged next to the projection 113 in the longitudinal direction X. The projection 113 projects out of the first encapsulation resin side surface 181 in the longitudinal direction X. In the present embodiment, the projection 113 is smaller than the inner body 112 in the lateral direction Y. The projection 113 may have any size in the lateral direction Y. In an example, the projection 113 and the inner body 112 may be equal in size in the lateral direction Y.

In a plan view, the inner body 112 is arranged so that the center of the inner body 112 with respect to the longitudinal direction X is located toward the first encapsulation resin side surface 181 from the center of the encapsulation resin 180 with respect to the longitudinal direction X. The inner body 112 includes a main surface 112a, a back surface 112b (refer to FIG. 11), a first side surface 112c, a second side surface 112d, and a third side surface 112e. The main surface 112a and the back surface 112b are faced away from each other in the thickness-wise direction Z. The main surface 112a is part of the main surface 110a of the substrate 110, and the back surface 112b is part of the back surface 110b of the substrate 110. Accordingly, the main surface 112a faces toward the encapsulation resin top surface 186, and the back surface 112b faces toward the encapsulation resin back surface 185. Further, the first side surface 112c faces toward the second encapsulation resin side surface 182, the second side surface 112d faces toward the third encapsulation resin side surface 83, and the third side surface 112e faces toward the fourth encapsulation resin side surface 184. The first side surface 112c extends in the lateral direction Y. The second side surface 112d is separated from and opposite to the third side surface 112e in the lateral direction Y. The second side surface 112d and the third side surface 112e extend in the longitudinal direction X.

The inner body 112 includes a narrow portion 114 at an end located toward the projection 113. The narrow portion 114 includes a recess 114a and a recess 114b. The recess 114a is recessed from the second side surface 112d toward the fourth encapsulation resin side surface 184 in the lateral direction Y, and the recess 114b is recessed from the third side surface 112e toward the third encapsulation resin side surface 83 in the lateral direction Y. The narrow portion 114 is smaller in size in the lateral direction Y than a part of the inner body 112 that does not correspond to the narrow portion 114 in the lateral direction Y. Further, the narrow portion 114 is smaller in size in the lateral direction Y than the projection 113. The narrow portion 114 is arranged next to the first encapsulation resin side surface 181 of the encapsulation resin 180 in the longitudinal direction X. The narrow portion 114 includes a through hole 115 that extends through the narrow portion 114 in the thickness-wise direction Z. In a plan view, the through hole 115 is elliptic with the lateral direction Y corresponding to the longitudinal direction.

The inner body 112 includes flanges 119a and 119b that extend from side surfaces of the inner body 112. The flange 119a projects from the second side surface 112d of the inner body 112 toward the third encapsulation resin side surface 83. The flange 119b projects from the third side surface 112e of the inner body 112 toward the fourth encapsulation resin side surface 184.

The flanges 119a and 119b are both arranged to be flush with the main surface 112a of the inner body 112. Thus, the main surface 110a of the substrate 110 includes the main surface 112a and the flanges 119a and 119b of the inner body 112. Further, the flanges 119a and 119b are located toward the main surface 112a of the inner body 112 from the back surface 112b. Thus, the back surface 110b of the substrate 110 includes the back surface 112b of the inner body 112. The flanges 119a and 119b hinder separation of the substrate 110 from the encapsulation resin 180.

Figure 11:
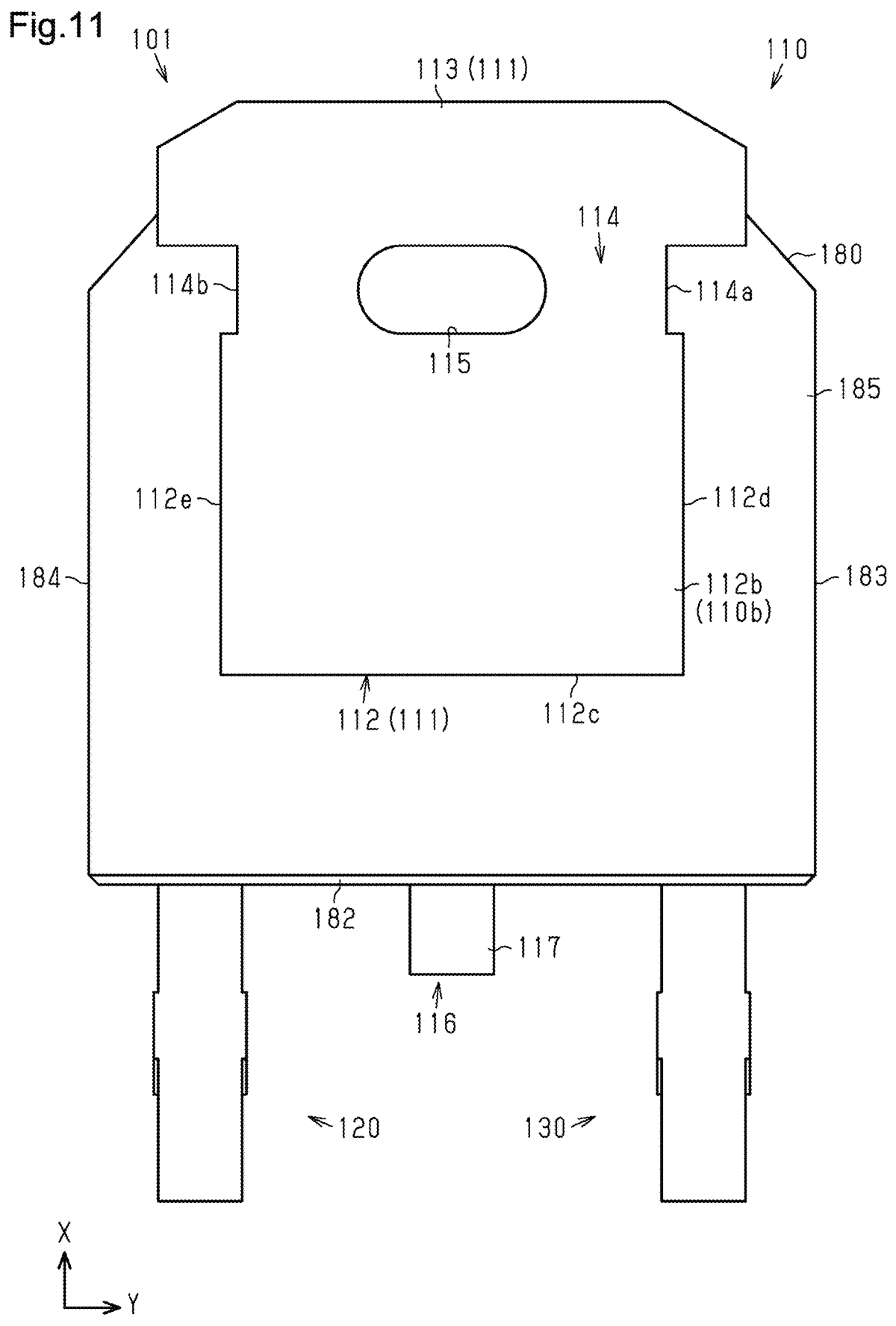

As shown in FIG. 11, the back surface 110b of the substrate 110 (back surface 112b of inner body 112) is exposed from the encapsulation resin back surface 185. This dissipates heat of the substrate 110 out of the semiconductor device 101. The encapsulation resin 180 fills the recesses 114a and 114b and the through hole 115 in the narrow portion 114 of the inner body 112. This further hinders separation of the substrate 110 from the encapsulation resin 180.

Figure 12:
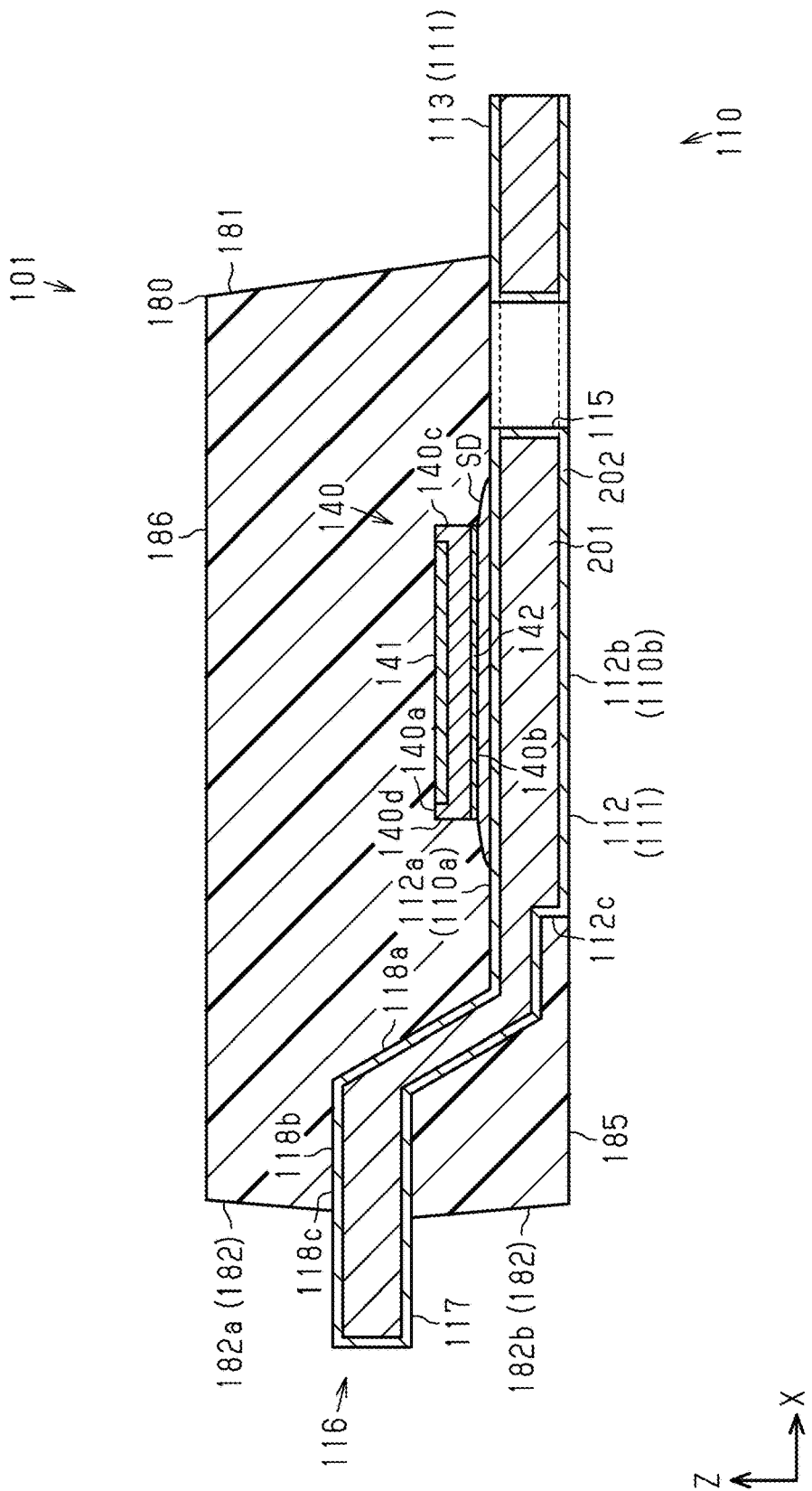
FIG. 12 is a cross-sectional view taken along line 12-12 in FIG. 10.

As shown in FIGS. 10 and 12, the lead portion 116 extends from the end of the inner body 112 that is located at the side of the first side surface 112c toward the second encapsulation resin side surface 182 and projects out of the second encapsulation resin side surface 182. The lead portion 116 can be divided into a terminal section 117 and a coupling section 118. The terminal section 117 projects out of the second encapsulation resin side surface 182. The coupling section 118 couples the terminal section 117 and the inner body 112.

As shown in FIG. 10, the coupling section 118 is located toward the second side surface 112d from the central part of the inner body 112 in the lateral direction Y. The coupling section 118 is continuous with the flange 119a. Specifically, the coupling section 118 includes a part connected to the inner body 112, and the part is thicker than the flanges 119a and 119b and thinner than the inner body 112.

As shown in FIGS. 10 and 12, the coupling section 118 includes an inclined part 118a. The inclined part 118a is inclined from the first side surface 112c of the inner body 112 so that the encapsulation resin top surface 186 becomes closer as the second encapsulation resin side surface 182 becomes closer. The coupling section 118 includes a middle part 118b located between the inclined part 118a and the terminal section 117. The middle part 118b is located toward the encapsulation resin top surface 186 from the main surface 112a of the inner body 112. In a plan view, the middle part 118b includes a bent 118c that is bent toward the fourth encapsulation resin side surface 184. The portion of the second encapsulation resin side surface 182 where the middle part 118b intersects is locates at the central part of the second encapsulation resin side surface 182 with respect to the lateral direction Y.

The terminal section 117 projects out of the central part of the second encapsulation resin side surface 182 with respect to the lateral direction Y. With respect to the thickness-wise direction Z, the terminal section 117 is located at the same position as the middle part 118b. In other words, the terminal section 117 is located toward the encapsulation resin top surface 186 from the main surface 112a of the inner body 112.

As shown in FIG. 10, in a plan view, the drive lead 120 and the control lead 130 are separated from the substrate 110 in the longitudinal direction X and located toward the second encapsulation resin side surface 182 of the encapsulation resin 180 from the substrate 110. The drive lead 120 is separated from the control lead 130 in the lateral direction Y. The lead portion 116 is located between the drive lead 120 and the control lead 130 in the lateral direction Y.

The drive lead 120 includes a drive pad 121, a drive terminal 122, and a coupling portion 1123. The drive pad 121 and the coupling portion 1123 define the inner lead 120B, and the drive terminal 122 defines the outer lead 120A. The coupling portion 1123 couples the drive pad 121 and the drive terminal 122. The drive pad 121 and the coupling portion 1123 are located between the substrate 110 and the second encapsulation resin side surface 182 in the longitudinal direction X. The drive pad 121 and the coupling portion 1123 are located toward the fourth encapsulation resin side surface 184 from the central part of the encapsulation resin 180 with respect to the lateral direction Y.

Figure 13:
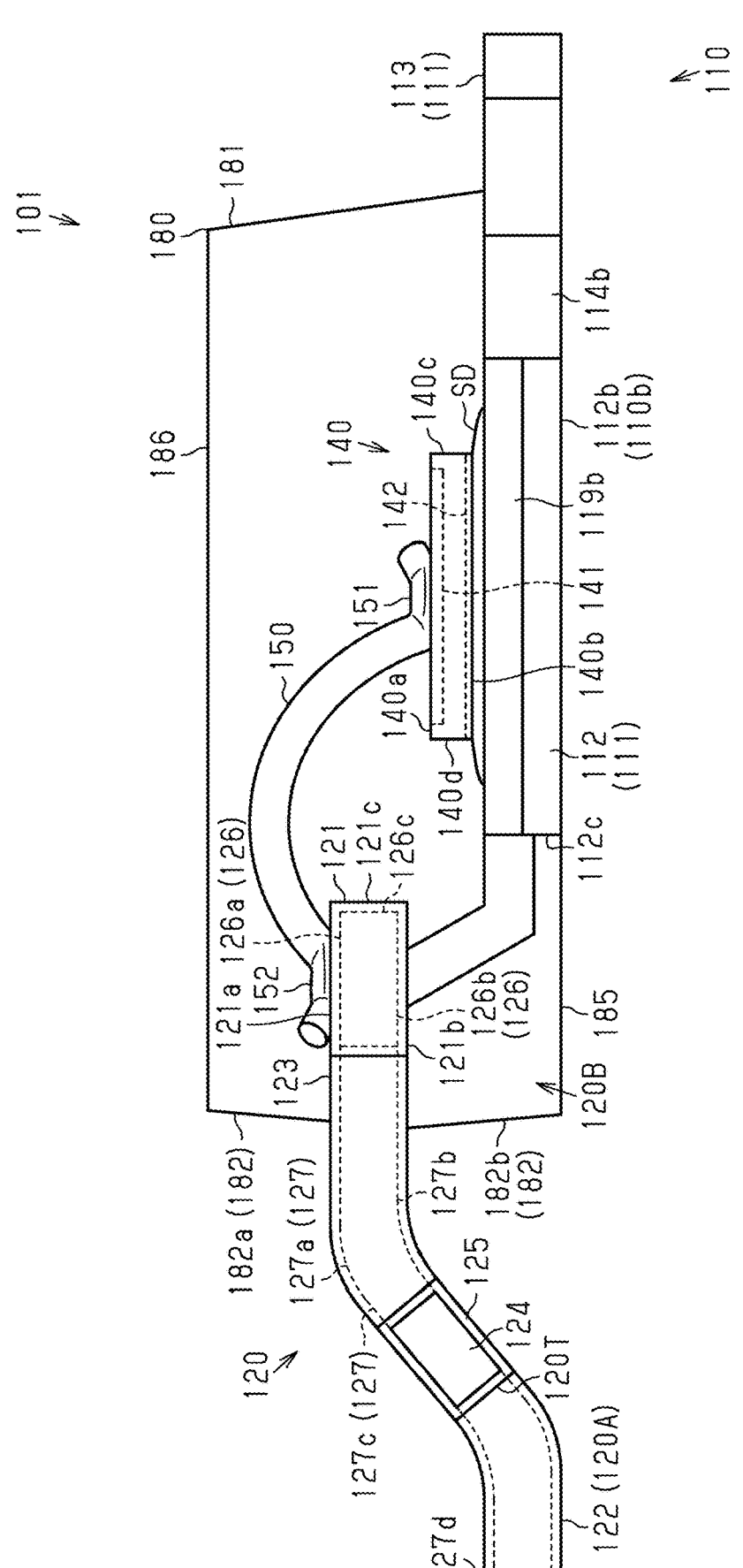
FIG. 13 is a schematic side view of the semiconductor device in accordance with the second embodiment.

In a plan view, the drive pad 121 is rectangular with the lateral direction Y corresponding to the long-side direction and the longitudinal direction X corresponding to the short-side direction. As shown in FIGS. 10 and 13, the drive pad 121 includes an upper surface 121a, a lower surface 121b, and side surfaces 121c. The upper surface 121a and the lower surface 121b are faced away from each other in the thickness-wise direction Z. The upper surface 121a is oriented in the same direction as the main surface 110a of the substrate 110. Each side surface 121c is oriented either in the longitudinal direction X or the lateral direction Y.

As shown in FIG. 13, the drive pad 121 is located toward the encapsulation resin top surface 186 from the main surface 112a of the inner body 112 in the thickness-wise direction Z. Further, the drive pad 121 is located toward the encapsulation resin top surface 186 from a main surface 140a of the semiconductor element 140 in the thickness-wise direction Z. As shown in FIGS. 12 and 13, in the present embodiment, the drive pad 121 is located at the same position as the middle part 118b of the lead portion 116 with respect to the thickness-wise direction Z.

As shown in FIG. 10, the coupling portion 1123 is continuous with the end of the drive pad 121 located at the side of the second encapsulation resin side surface 182. The coupling portion 1123 is located toward the fourth encapsulation resin side surface 184 from the central part of the drive pad 121 with respect to the lateral direction Y. The drive terminal 122 forms a source terminal. As shown in FIG. 13, the drive terminal 122 projects out of a first inclined surface 182a of the second encapsulation resin side surface 182.

As shown in FIG. 10, the control lead 130 includes a control pad 131, a control terminal 132, and a coupling portion 1133. The control pad 131 and the coupling portion 1133 define the inner lead 130B. The control terminal 132 defines the outer lead 130A. The coupling portion 1133 couples the control pad 131 and the control terminal 132. The control pad 131 and the coupling portion 1133 are located between the substrate 110 and the second encapsulation resin side surface 182 in the longitudinal direction X. The control pad 131 and the coupling portion 1133 are located toward the third encapsulation resin side surface 83 from the central part of the encapsulation resin 180 in the lateral direction Y.

In a plan view, the control pad 131 is rectangular with the lateral direction Y corresponding to the long-side direction and the longitudinal direction X corresponding to the short-side direction. As shown in FIGS. 10 and 13, the control pad 131 includes an upper surface 131a, a lower surface 131b, and side surfaces 131c. The upper surface 131a and the lower surface 131b are faced away from each other in the thickness-wise direction Z. The upper surface 131a is oriented in the same direction as the main surface 110a of the substrate 110. Each side surface 131c is oriented either in the longitudinal direction X or the lateral direction Y.

The control pad 131 is smaller than the drive pad 121 in the lateral direction Y In the thickness-wise direction Z, the control pad 131 is located toward the encapsulation resin top surface 186 from the main surface 112*a* of the inner body 112. Further, the control pad 131 is located toward the encapsulation resin top surface 186 from the main surface 140*a* of the semiconductor element 140 in the thickness-wise direction Z. In the present embodiment, the control pad 131 is located at the same position as the middle part 118*b* of the lead portion 116 with respect to the thickness-wise direction Z.

The coupling portion 1133 is continuous with the end of the control pad 131 that is located at the side of the second encapsulation resin side surface 182. The coupling portion 1133 is located on the control pad 131 toward the third encapsulation resin side surface 83 in the lateral direction Y The control terminal 132 forms a gate terminal. The control terminal 132 projects out of the first inclined surface 182*a* of the second encapsulation resin side surface 182.

As shown in FIG. 12, the substrate 110 includes a first base material (substrate base material) 201 and a first plated layer (substrate plated layer) 202.

The first base material 201 is formed of copper (Cu). In the present embodiment, being formed of Cu means formed from Cu or an alloy including Cu. The first base material 201 is formed by, for example, a metal sheet formed through rolling. The first base material 201 includes the lead portion 116 and the flanges 119*a* and 119*b* that are formed by pressing the metal sheet. The first plated layer 202 is formed to cover the surfaces of the first base material 201. The first plated layer 202 is formed of nickel (Ni). Being formed of Ni means formed from Ni or an alloy including Ni.

The first base material 201 and the first plated layer 202 form each part of the substrate 110. In other words, the first base material 201 includes the part that forms the plate-shaped substrate body 111 and the part that forms the lead portion 116. Further, the surfaces of the first plated layer 202, which covers the surfaces of the first base material 201, form the surfaces of the substrate 110, that is, the surfaces of the substrate body 111 and the surfaces of the lead portion 116.

As shown in FIG. 13, the drive lead 120 includes a second base material 124 and a second plated layer 125.

The second base material 124 includes a pad portion 126 and a lead portion 127. The pad portion 126 forms the drive pad 121. The lead portion 127 forms the drive terminal 122 and the coupling portion 123.

As shown in FIGS. 10 and 13, the pad portion 126 is box-shaped. The pad portion 126 includes an upper surface 126*a*, a lower surface 126*b*, and side surfaces 126*c*. The upper surface 126*a* and the lower surface 126*b* are faced away from each other in the thickness-wise direction Z. The upper surface 126*a* is oriented in the same direction as the main surface 110*a* of the substrate 110. Each side surface 126*c* is oriented either in the longitudinal direction X or the lateral direction Y. The second plated layer 125 covers the surfaces of the pad portion 126. In other words, the second plated layer 125 covers the upper surface 126*a*, the lower surface 126*b*, and the side surfaces 126*c* of the pad portion 126. Therefore, the surfaces of the second plated layer 125, which covers the pad portion 126, correspond to the upper surface 121*a*, the lower surface 121*b*, the side surfaces 121*c* of the drive pad 121.

The lead portion 127 extends from the pad portion 126 in the longitudinal direction X and projects out of the encapsulation resin 180. The lead portion 127 includes an upper surface 127*a*, a lower surface 127*b*, a side surface 127*c*, and an end surface 127*d*. The upper surface 127*a* and the lower surface 127*b* are faced away from each other in the thickness-wise direction Z. The side surface 127*c* is oriented in the lateral direction Y The end surface 127*d* is oriented in the longitudinal direction X. The end surface 127*d* is a surface located at a distal end of the lead portion 127, which projects out of the encapsulation resin 180. The second plated layer 125 covers the upper surface 127*a*, the lower surface 127*b*, and the side surface 127*c* of the lead portion 127. Therefore, the surfaces of the second plated layer 125, which covers the lead portion 127, correspond to the surfaces of the drive terminal 122 and the coupling portion 123.

In the present embodiment, the surface located at the distal end of the lead portion 127, or the end surface 127*d*, is not covered by the second plated layer 125. Thus, the end surface 127*d* of the lead portion 127 is exposed from the second plated layer 125. In other words, the second base material 124 is exposed from the second plated layer 125 at the distal end surface of the drive terminal 122.

Figure 15:
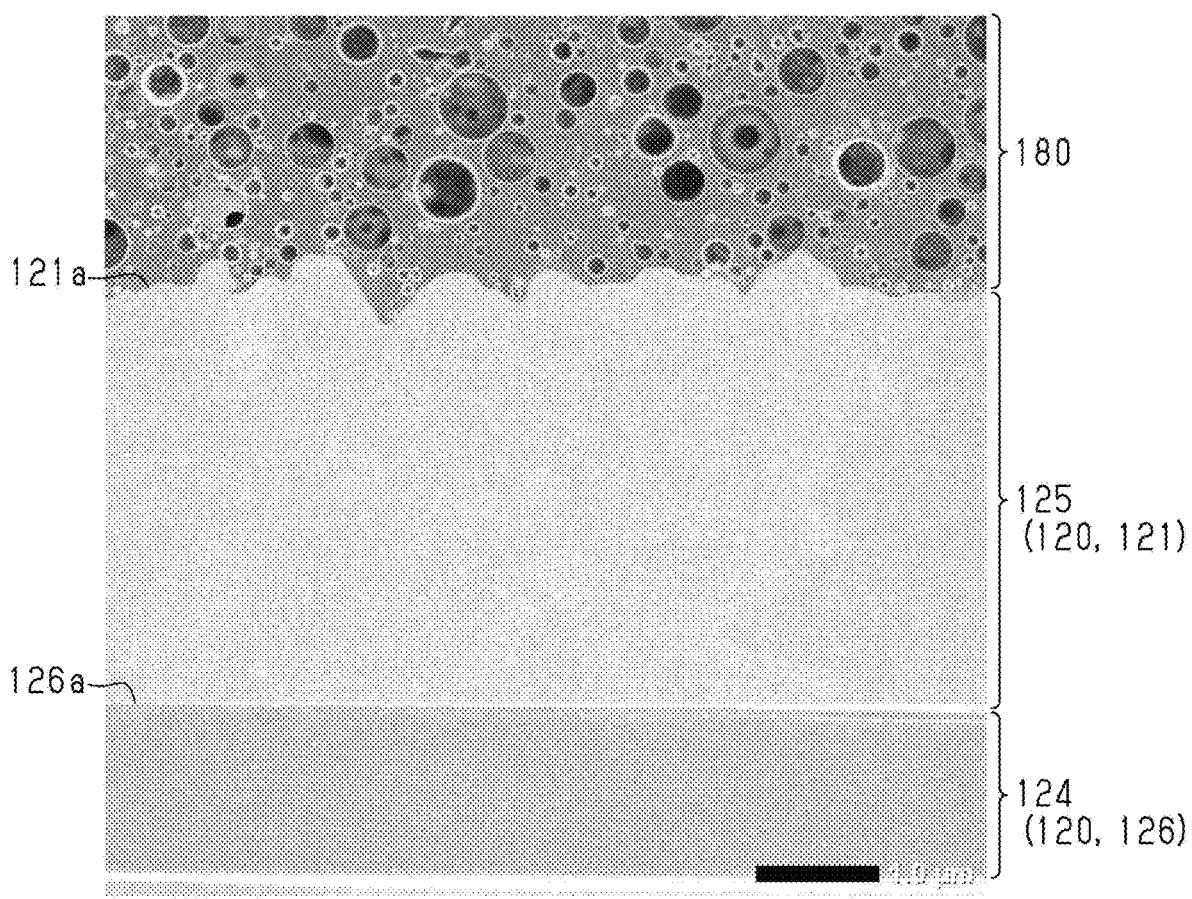
FIG. 15 is a photograph showing a cross section of a drive pad and an encapsulation resin.

The second base material 124 is formed of Cu. The second base material 124 is formed by, for example, a metal sheet formed through rolling in the same manner as the first base material 201. The second base material 124 includes the lead portion 127 and the pad portion 126 that are formed by pressing the metal sheet. The second plated layer 125 is formed of Ni. As shown in FIG. 15, the second plated layer 125 is a rough-surface plated layer having a rougher surface than the second base material 124. The second plated layer 125, which is a rough-surface plated layer, can be obtained by, for example, performing an electrolytic plating process on the second base material 124 of the drive lead 120.

As shown in FIG. 14, the control lead 130 includes a third base material 134 and a third plated layer 135.

The third base material 134 includes a pad portion 136 and a lead portion 137. The pad portion 136 forms the control pad 131. The lead portion 137 forms the control terminal 132 and the coupling portion 133.

As shown in FIGS. 10 and 13, the pad portion 136 is box-shaped. The pad portion 136 includes an upper surface 127*a*, a lower surface 127*b*, and side surfaces 127*c*. The upper surface 127*a* and the lower surface 127*b* are faced away from each other in the thickness-wise direction. The upper surface 127*a* is oriented in the same direction as the main surface 110*a* of the substrate 110. Each side surface 127*c* is oriented either in the longitudinal direction X or the lateral direction Y. The third plated layer 135 covers the surfaces of the pad portion 136. In other words, the third plated layer 135 covers the upper surface 136*a*, the lower surface 136*b*, and the side surfaces 136*c* of the pad portion 136. Therefore, the surfaces of the third plated layer 135, which covers the pad portion 136, correspond to the upper surface 131*a*, the lower surface 131*b*, the side surfaces 131*c* of the control pad 131.

The lead portion 137 extends from the pad portion 136 in the longitudinal direction X and projects out of the encapsulation resin 180. The lead portion 137 includes an upper surface 137*a*, a lower surface 137*b*, a side surface 137*c*, and an end surface 137*d*. The upper surface 137*a* and the lower surface 137*b* are faced away from each other in the thick-ness-wise direction Z. The side surface 137*c* is oriented in the lateral direction Y The end surface 137*d* is oriented in the longitudinal direction X. The end surface 137*d* is a surface located at a distal end of the lead portion 137, which projects out of the encapsulation resin 180. The third plated layer 135 covers the upper surface 137*a*, the lower surface 137*b*, and the side surface 137*c* of the lead portion 137. Therefore, the surface of the third plated layer 135, which covers the lead portion 137, correspond to the surfaces of the control terminal 132 and the coupling portion 133.

In the present embodiment, the end surface 137d, that is, the surface located at the distal end of the lead portion 137, is not covered by the third plated layer 135. Thus, the end surface 137d of the lead portion 137 is exposed from the third plated layer 135. In other words, the third base material 134 is exposed from the third plated layer 135 at the distal end surface of the control terminal 132.

The third base material 134 is formed of Cu. The third base material 134 is formed by, for example, a metal sheet formed through rolling in the same manner as the first base material 201. The third base material 134 includes the lead portion 137 and the pad portion 136 that are formed by pressing the metal sheet. The third plated layer 135 is formed of Ni. The third plated layer 135 is a rough-surface plated layer having a rougher surface than the third base material 134 in the same manner as the second plated layer 125. The third plated layer 135, which is a rough-surface plated layer, can be obtained by, for example, performing an electrolytic plating process on the third base material 134 of the control lead 130.

In the present embodiment, in the same manner as the second plated layer 125 and the third plated layer 135, the first plated layer 202 of the substrate 110 is a rough-surface plated layer having a rougher surface than the first base material 201 of the substrate 110. The substrate 110, the drive lead 120, and the control lead 130 can be formed from a lead frame. The lead frame including the substrate 110, the drive lead 120, and the control lead 130 can be obtained by stamping a metal sheet. The first, second, and third plated layers 202, 125, and 135, which are rough-surface plated layers, are formed on the lead frame by performing, for example, an electrolytic plating process.

After mounting the semiconductor element 140, connecting the drive wire 150 and the control wire 160, and forming the encapsulation resin 180, the lead frame is cut at predetermined positions and fragmented into the semiconductor device 101. When the lead frame is cut, the second base material 124 and the third base material 134 are respectively exposed from the end surface 137d of the drive lead 120 and the end surface 137d of the control lead 130. Further, as shown in FIG. 12, in the same manner as the drive lead 120 and the control lead 130, the first base material 201 is exposed at a cut position, for example, from the surface of the projection 113 of the substrate 110 oriented in the longitudinal direction X. Also, as shown in FIGS. 9 to 11, 12, and 13, the drive lead 120 and the control lead 130 include projections 1120T and projections 130T on corresponding side surfaces. The projections 1120T and 130T are the remainders of coupling members (tie bars) that couple the second base material 124 of the drive lead 120 and the third base material 134 of the control lead to a frame material of the lead frame when the coupling members are cut. The second base material 124 and the third base material 134 are respectively exposed from the projections 1120T and 130T.

As shown in FIGS. 12 and 13, the semiconductor element 140 is mounted on the main surface 112a of the inner body 112 by solder SD. As shown in FIG. 10, in the present embodiment, the semiconductor element 140 is located at the central part of the inner body 112. The semiconductor element 140 and the drive pad 121 are arranged at different positions as viewed in the longitudinal direction X. Further, the semiconductor element 140 and the control pad 131 are arranged at different positions as viewed in the longitudinal direction X.

The semiconductor element 140 is a silicon carbide (SiC) chip. In the present embodiment, the semiconductor element 140 uses a metal-oxide-semiconductor field-effect transistor (SiCMOSFET). The semiconductor element 140 (SiCMOS-FET) is an element that allows for high-speed switching. The switching frequency is, for example, one kHz or greater and several hundred kHz or less.

The semiconductor element 140 has the shape of a plate. Specifically, the semiconductor element 140 is, for example, square in a plan view. As shown in FIGS. 10 and 12, the semiconductor element 140 includes the main surface 140a, a back surface 140b, and side surfaces 140c to 140f. The main surface 140a and the back surface 140b are faced away from each other in the thickness-wise direction Z. The main surface 140a faces toward the encapsulation resin top surface 186. That is, the main surface 140a is oriented in the same direction as the main surface 110a of the substrate 110. The back surface 140b faces toward the encapsulation resin back surface 185. The back surface 140b is opposite to the main surface 112a of the inner body 112. The side surface 140c faces toward the first encapsulation resin side surface 181, the side surface 140d faces toward the second encapsulation resin side surface 182, the side surface 140e faces toward the third encapsulation resin side surface 83, and the side surface 140f faces toward the fourth encapsulation resin side surface 184.

A main surface drive electrode 141 and a control electrode 143 are formed on the main surface 140a. The main surface drive electrode 141 and the control electrode 143 each form a main surface electrode in the main surface 140a of the semiconductor element 140. A back surface drive electrode (back surface electrode) 142 is formed on the back surface 140b (refer to FIGS. 12 to 14). In the present embodiment, the main surface drive electrode 141 forms a source electrode, and the back surface drive electrode 142 forms a drain electrode. The control electrode 143 forms as a gate electrode. The back surface drive electrode 142 is electrically connected to the inner body 112 by the solder SD. The solder SD is, for example, lead solder.

The semiconductor element 140 includes a passivation film formed on the main surface 140a. The passivation film includes openings that expose the electrode at the side of the main surface 140a of the semiconductor element 140 as the main surface drive electrode 141 and the control electrode 143.

As shown in FIGS. 9 and 10, the semiconductor device 101 includes a single drive wire 150 and a single control wire 160.

In the present embodiment, the drive wire 150 and the control wire 160 are formed of the same metal. In the present embodiment, the drive wire 150 and the control wire 160 are formed of aluminum (Al). Being formed of Al means formed from Al or an alloy including Al.

The central part of the drive wire 150 has a circular cross section taken in a direction perpendicular to the longitudinal direction of the drive wire 150. The central part of the control wire 160 has a circular cross section taken in a direction perpendicular to the longitudinal direction of the control wire 160. The diameter of the drive wire 150 is greater than that of the control wire 160. In other words, the drive wire 150 is a large-diameter aluminum wire. The diameter of the drive wire 150 is, for example, 1200 μm or greater and 1600 μm or less. The diameter of the control wire 160 is, for example, 140 μm or greater and 100 μm or less.

The drive wire 150 includes a first end 151 and a second end 152. The first end 151 is bonded to the main surface drive electrode 141 of the semiconductor element 140. The second end 152 is bonded to the second plated layer 125, which forms the upper surface 121a of the drive pad 121.

The drive wire 150 is bonded through, for example, ultrasonic bonding to the main surface drive electrode 141 and the drive pad 121.

As shown in FIGS. 9 and 10, the control wire 160 includes a first end 161 and a second end 162. The first end 161 is bonded to the control electrode 143 of the semiconductor element 140. The second end 162 is bonded to the third plated layer 135, which forms the upper surface 131*a* of the control pad 131. The control wire 160 is bonded through, for example, ultrasonic bonding to the control electrode 143 and the control pad 131.

Operation

The operation of the present embodiment will now be described.

The semiconductor device 101 in the present embodiment includes the substrate 110, the drive pad 121, and the control pad 131. The drive pad 121 and the control pad 131 are arranged adjacent to the substrate 110 in the longitudinal direction X. The semiconductor element 140 is mounted on the main surface 110*a* of the substrate 110. The first end 151 of the drive wire 150 formed of Al is bonded to the main surface drive electrode 141 of the semiconductor element 140, and the second end 152 of the drive wire 150 is bonded to the drive pad 121. The first end 161 of the control wire 160 formed of Al is bonded to the control electrode 143 of the semiconductor element 140, and the second end 162 of the control wire 160 is bonded to the control pad 131. The drive pad 121 includes the second base material 124 formed of Cu and the second plated layer 125 formed of Ni. The second plated layer 125 covers the surfaces of the second base material 124. The control pad 131 includes the third base material 134 formed of Cu and the third plated layer 135 formed of Ni. The third plated layer 135 covers the surfaces of the second base material 124. The second plated layer 125 is a rough-surface plated layer having a rougher surface than the second base material 124. The third plated layer 135 is a rough-surface plated layer having a rougher surface than the third base material 134. The encapsulation resin 180 encapsulates the semiconductor element 140, the drive pad 121, the control pad 131, the drive wire 150, and the control wire 160.

The second plated layer 125, which is formed of Ni, hinders separation of the drive wire 150 from the drive pad 121. If the drive pad 121 is formed of only Cu, for example, the growth of an intermetallic compound may be advanced by the heat produced between the drive wire 150, which is formed of Al, and the drive pad 121. This may separate the drive wire 150 from the drive pad 121. In this respect, the second plated layer 125, which is formed of Ni, prevents the formation of an intermetallic compound and hinders separation of the drive wire 150 from the drive pad 121.

The second plated layer 125 of the drive pad 121 is a rough-surface plated layer having a rougher surface than the second base material 124 of the drive pad 121. Accordingly, the surfaces of the second plated layer 125 are easily adhered to the encapsulation resin 180, which encapsulates the drive pad 121. Thus, the second plated layer 125 hinders delamination of the encapsulation resin 180 from the drive pad 121. Delamination of the encapsulation resin 180 from the drive pad 121 may break the drive wire 150, which is bonded to the drive pad 121. In this respect, the second plated layer 125 hinders delamination of the encapsulation resin 180 from the drive pad 121 and avoids breakage of the drive wire 150.

The third plated layer 135, which is formed of Ni, hinders separation of the control wire 160 from the control pad 131. If the control pad 131 is formed of only Cu, for example, the growth of an intermetallic compound may be advanced by the heat produced between the control wire 160, which is formed of Al, and the control pad 131. This may separate the control wire 160 from the control pad 131. In this respect, the third plated layer 135, which is formed of Ni, prevents the formation of an intermetallic compound and hinders separation of the control wire 160 from the control pad 131.

The third plated layer 135 of the control pad 131 is a rough-surface plated layer having a rougher surface than the third base material 134 of the control pad 131. Accordingly, the surfaces of the third plated layer 135 are easily adhered to the encapsulation resin 180, which encapsulates the control pad 131. Thus, the third plated layer 135 hinders delamination of the encapsulation resin 180 from the control pad 131. Delamination of the encapsulation resin 180 from the control pad 131 may break the control wire 160, which is bonded to the control pad 131. In this respect, the third plated layer 135 hinders delamination of the encapsulation resin 180 from the control pad 131 and avoids breakage of the control wire 160.

Large currents flow to the semiconductor device 101 including the semiconductor element 140 formed of SiC. Thus, the large-diameter drive wire 150, which is formed of Al, is used between the main surface drive electrode 141 of the semiconductor element 140 and the drive pad 121. If a gold (Au) or Cu wire were to be used, multiple wires would need to be connected in accordance with the current. This would increase the number of processes required for connection and enlarge the pad area thereby increasing the size of the semiconductor device. In the semiconductor device 101 of the present embodiment, the single drive wire 150 allows for the flow of the necessary current without increasing manufacturing processes or increasing the size of the semiconductor device.

The semiconductor device 101 in the present embodiment has the following advantages.

(2-1) The second plated layer 125, which is formed of Ni, hinders separation of the drive wire 150 from the drive pad 121. If the drive pad 121 is formed of only Cu, for example, the growth of an intermetallic compound may be advanced by the heat produced between the drive wire 150, which is formed of Al, and the drive pad 121. This may separate the drive wire 150 from the drive pad 121. In this respect, the second plated layer 125, which is formed of Ni, prevents the formation of an intermetallic compound and hinders separation of the drive wire 150 from the drive pad 121.

(2-2) The second plated layer 125 of the drive pad 121 is a rough-surface plated layer having a rougher surface than the second base material 124 of the drive pad 121. Accordingly, the surfaces of the second plated layer 125 are easily adhered to the encapsulation resin 180, which encapsulates the drive pad 121. Thus, the second plated layer 125 hinders delamination of the encapsulation resin 180 from the drive pad 121. Delamination of the encapsulation resin 180 from the drive pad 121 may break the drive wire 150, which is bonded to the drive pad 121. In this respect, the second plated layer 125 hinders delamination of the encapsulation resin 180 from the drive pad 121 and avoids breakage of the drive wire 150.

(2-3) The third plated layer 135, which is formed of Ni, hinders separation of the control wire 160 from the control pad 131. If the control pad 131 is formed of only Cu, for example, the growth of an intermetallic compound may be advanced by the heat produced between the control wire 160, which are formed of Al, and the control pad 131. This may separate the control wire 160 from the control pad 131. In this respect, the third plated layer 135, which is formed of Ni, prevents the formation of an intermetallic compound and hinders separation of the control wire 160 from the control pad 131.

(2-4) The third plated layer 135 of the control pad 131 is a rough-surface plated layer having a rougher surface than the third base material 134 of the control pad 131. Accordingly, the surfaces of the third plated layer 135 are easily adhered to the encapsulation resin 180, which encapsulates the control pad 131. Thus, the third plated layer 135 hinders delamination of the encapsulation resin 180 from the control pad 131. Delamination of the encapsulation resin 180 from the control pad 131 may break the control wire 160, which is bonded to the control pad 131. In this respect, the third plated layer 135 hinders delamination of the encapsulation resin 180 from the control pad 131 and avoids breakage of the control wire 160.

(2-5) Large currents flow to the semiconductor device 101 including the semiconductor element 140 formed of SiC. Thus, the large-diameter drive wire 150, which is formed of Al, is used between the main surface drive electrode 141 of the semiconductor element 140 and the drive pad 121. If a gold (Au) or Cu wire were to be used, multiple wires would need to be connected in accordance with the current. This would increase the number of processes required for connection and enlarge the pad area thereby increasing the size of the semiconductor device. In the semiconductor device 101 of the present embodiment, the single drive wire 150 allows for the flow of the necessary current without increasing manufacturing processes or increasing the size of the semiconductor device.

Modified Examples

The semiconductor device in the above embodiments may be modified as follows. The above embodiments and the following modifications can be combined as long as the combined modifications remain technically consistent with each other. In the modified examples described hereafter, same reference numerals are given to those components that are the same as the corresponding components of the above embodiments. Such components will not be described in detail.

In the semiconductor device 1 of the first embodiment, the plated layers 71 to 73 may be rough-surface plated layers that have surfaces rougher than surfaces of the drive pad 21, 31 formed of the base material, such as the connection surfaces 24 and 34. The surfaces of such plated layers 71 to 73 will be easily adhered to the encapsulation resin 80, which encapsulates the drive pad 21, 31 and the coupling section 18. Thus, the plated layers 71 to 73 hinder delamination of the encapsulation resin 80 from the drive pad 21, 31 and the coupling section 18. Delamination of the encapsulation resin 80 from the drive pad 21, 31 may break the wires 50 and 60, which are bonded to the drive pad 21, 31. In this manner, the plated layers 71 to 72 hinder delamination of the encapsulation resin 80 from the drive pad 21, 31 and avoids breakage of the wires 50 and 60.

Figure 8:
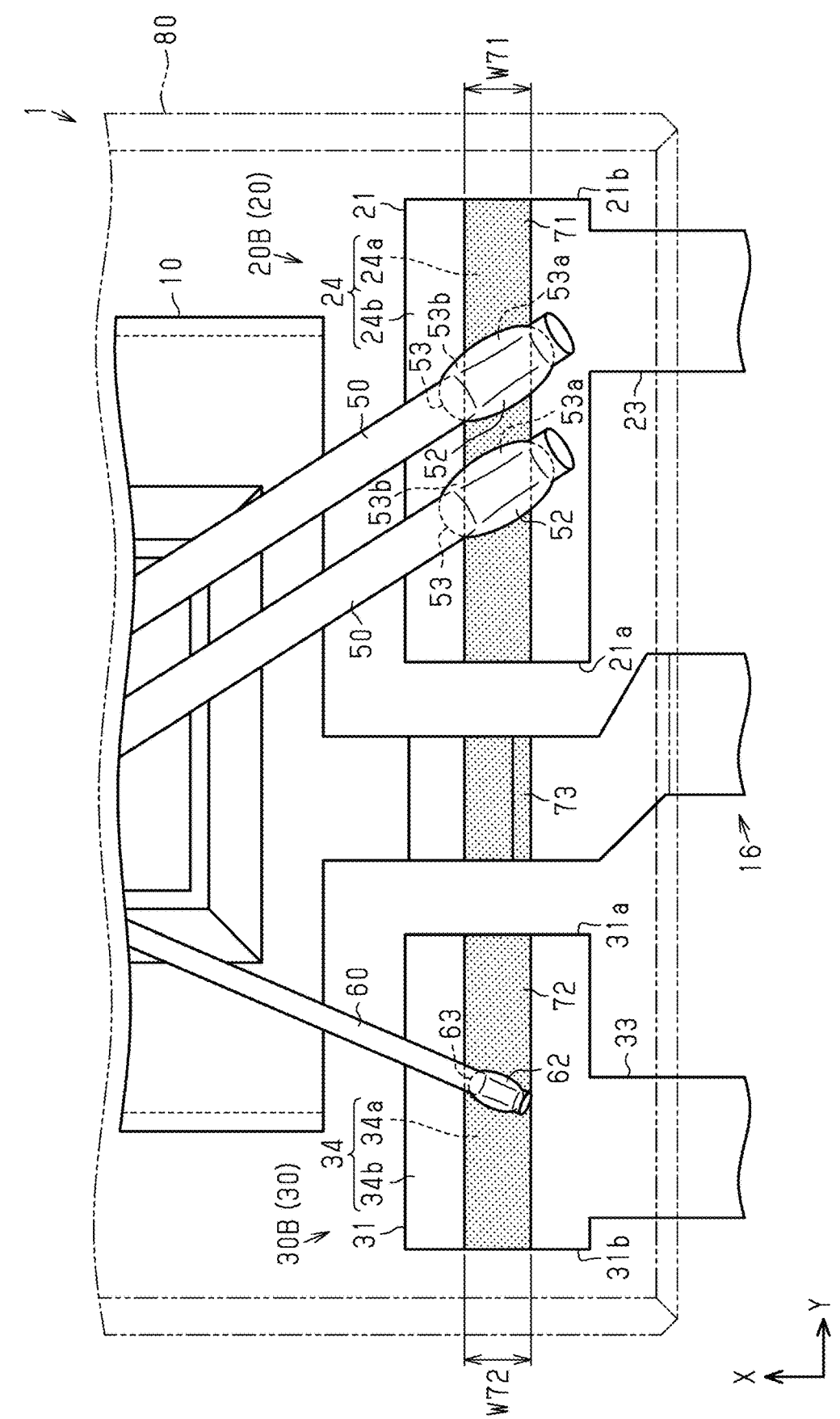
FIG. 8 is a partially enlarged plan view of a semiconductor device in accordance with another modified example of the first embodiment.

The number of the drive wires 50 may be two or more in accordance with the amount of current applied to the semiconductor device 1. Even in this case, the number of the drive wires 50 is considerably less compared to when wires of Au or Cu are used. Thus, the number of manufacturing steps can be kept low, and enlargement of the device can be avoided. In this case, as shown in FIG. 8, the bonding portion 53 located at the second end 52 of each drive wire 50 may include the region 53a that is bonded to the upper surface of the plated layer 71 and the region 53b that is bonded to the region 24b, which is exposed from the plated layer 71 on the connection surface 24 of the drive pad 21. Further, the width W71 of the plated layer 71 may be set so that the bonding portion 53 of each drive wire 50 is entirely bonded to the plated layer 71.

Figure 7:
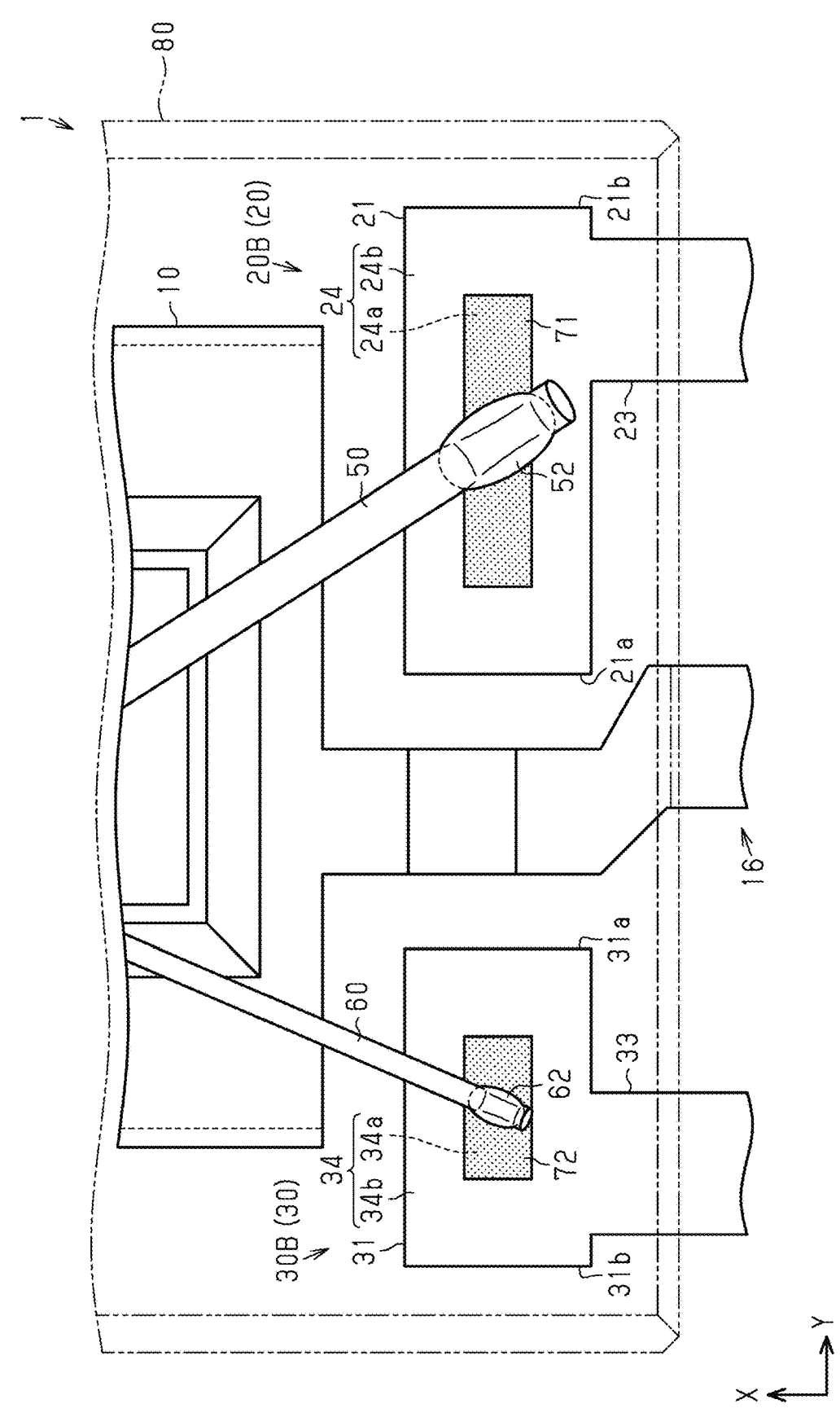
FIG. 7 is a partially enlarged plan view of a semiconductor device in accordance with a modified example of the first embodiment.

As shown in FIG. 7, the plated layer 71 may cover the central part of the drive pad 21. In the same manner, the plated layer 72 may cover the central part of the control pad 31.

The plated layer 73 may be omitted from the lead portion 16.

The width W71 of the plated layer 71 of the drive pad 21 may differ from the width W72 of the plated layer 72 of the control pad 31. For example, the bonding portion 53 at the second end 52 of the drive wire 50 does not have to extend beyond the plated layer 71. Alternatively, the plated layer 71 may cover the connection surface 24 and extend to the ends of the drive pad 21 in the longitudinal direction X.

The number of the drive wires 150 may be two or more in accordance with amount of current applied to the semiconductor device 101. Even in this case, the number of the drive wire 150 is considerably less compared to when wires of Au or Cu are used. Thus, the number of manufacturing steps can be kept low, and enlargement of the device can be avoided.

The second plated layer 125 may cover part of or all of the upper surface 126a on the pad portion 126 of the second base material 124. In the same manner, the third plated layer 135 may cover part of or all of the upper surface 136 on the pad portion 136 of the third base material 134.

The first plated layer 202 of the substrate 110 may be omitted.

The semiconductor element 40, 140 may be a diode or a large scale integration (LSI) chip.

Embodiments

Technical concepts that can be understood from the above embodiments and the modified examples will now be described.

Embodiment 1

A semiconductor device, including:

a substrate including a main surface;

a semiconductor element mounted on the main surface and including a main surface electrode oriented in the same direction as the main surface;

a connection pad formed of Cu, separated from the substrate in a first direction that is parallel to the main surface, and including a connection surface oriented in the same direction as the main surface;

a plated layer formed of Ni and partially covering the connection surface;

a wire formed of Al and including a first end bonded to the main surface electrode and a second end bonded to the plated layer; and an encapsulation resin encapsulating the semiconductor element, the connection pad, the plated layer, and the wire.

Embodiment 2

The semiconductor device according to embodiment 1, in which the main surface electrode includes a control electrode and a drive electrode, the connection pad includes a control pad and a drive pad that are separated from the substrate in the first direction that is parallel to the main surface and separated from each other in a second direction, the second direction being parallel to the main surface and orthogonal to the first direction, and the wire includes a control wire connecting the control electrode and the control pad and a drive wire connecting the drive electrode and the drive pad.

Embodiment 3

The semiconductor device according to embodiment 2, in which the control wire has a smaller diameter than the drive wire.

Embodiment 4

The semiconductor device according to embodiment 3, in which the diameter of the control wire is 40 μm or greater and 100 μm or less, and the diameter of the drive wire is 200 μm or greater and 600 μm or less.

Embodiment 5

The semiconductor device according to any one of embodiments 2 to 4, in which the control wire includes a bonding portion bonded to the control pad and formed on a plated layer of the control pad, and the control wire includes a bonding portion bonded to the drive pad, formed on a plated layer of the drive pad, and extending to the connection surface of the drive pad.

Embodiment 6

The semiconductor device according to embodiment 5, in which the bonding portion of the drive wire at a region bonded to an upper surface of the plated layer has an area that is greater than or equal to a cross-sectional area of the drive wire.

Embodiment 7

The semiconductor device according to any one of embodiments 2 to 6, in which the connection surface of the control pad includes a region covered by the plated layer and a region exposed from the plated layer.

Embodiment 8

The semiconductor device according to any one of embodiments 2 to 7, in which the connection surface of the drive pad is entirely covered by the plated layer.

Embodiment 9

The semiconductor device according to any one of embodiments 1 to 8, in which the wire is bonded to the connection pad by ultrasonic bonding.

Embodiment 10

The semiconductor device according to any one of embodiments 1 to 9, in which the semiconductor element includes a back surface electrode faced away from the main surface electrode, the substrate is formed of Cu, and the back surface electrode is connected to the substrate by solder.

Embodiment 11

The semiconductor device according to any one of embodiments 1 to 10, in which the plated layer is a rough-surface plated layer having a rougher surface than the upper surface of the base material.

Embodiment 12

A semiconductor device, including:

a substrate including a main surface;

a semiconductor element mounted on the main surface and including a main surface electrode oriented in the same direction as the main surface;

a connection pad separated from the substrate in a first direction that is parallel to the main surface;

a wire including a first end bonded to the main surface electrode and a second end bonded to the connection pad; and an encapsulation resin encapsulating the semiconductor element, the connection pad, and the wire, in which the wire is formed of Al, the connection pad includes a base material formed of Cu and including an upper surface oriented in the same direction as the main surface, and a plated layer formed of Ni and covering the upper surface of the base material, and the plated layer is a rough-surface plated layer having a rougher surface than the upper surface of the base material.

Embodiment 13

The semiconductor device according to embodiment 12, in which the base material includes a back surface faced away from the main surface and a side surface between the main surface and the back surface, and the plated layer covers the main surface, the back surface, and the side surface of the base material.

Embodiment 14

The semiconductor device according to embodiment 12 or 13, further including a terminal extending from the connection pad in the first direction and projecting out of a first side surface of the encapsulation resin, in which the base material includes a pad portion forming the connection pad and a lead portion forming the terminal, and the plated layer covers a surface of the pad portion and the lead portion.

Embodiment 15

The semiconductor device according to embodiment 14, in which the terminal includes an end surface where the base material is exposed.

27

Embodiment 16

The semiconductor device according to any one of embodiments 12 to 15, in which
the substrate includes a substrate base material formed of Cu and a substrate plated layer covering a surface of the substrate base material, and
the substrate plated layer is a rough-surface plated layer having a rougher surface than the substrate base material.

Embodiment 17

The semiconductor device according to any one of embodiments 12 to 16, in which the wire is bonded to the connection pad by ultrasonic bonding.

Embodiment 18

The semiconductor device according to any one of embodiments 12 to 17, in which
the semiconductor element is a transistor,
the main surface electrode includes a control electrode and a drive electrode,
the connection pad includes a control pad and a drive pad that are separated from the substrate in the first direction that is parallel to the main surface and separated from each other in a second direction, the second direction being parallel to the main surface and orthogonal to the first direction, and
the wire includes a control wire connecting the control electrode and the control pad and includes a drive wire connecting the drive electrode and the drive pad.

Embodiment 19

The semiconductor device according to embodiment 18, in which the control wire has a smaller diameter than the drive wire.

Embodiment 20

The semiconductor device according to embodiment 18 or 19, in which
the diameter of the control wire is 40 μm or greater and 100 μm or less, and
the diameter of the drive wire is 200 μm or greater and 600 μm or less.

Embodiment 21

The semiconductor device according to any one of embodiments 12 to 20, in which the substrate includes a frame formed of Cu and a rough-surface plated layer covering a surface of the frame.

Embodiment 22

The semiconductor device according to any one of embodiments 12 to 21, in which
the substrate includes a back surface faced away from the main surface, and
the back surface is exposed from the encapsulation resin.

Embodiment 23

The semiconductor device according to any one of embodiments 12 to 22, in which

28 the semiconductor element includes a back surface electrode faced away from the main surface electrode,
the back surface electrode is connected to the substrate by solder.

Embodiment 24

The semiconductor device according to any one of embodiments 1 to 23, in which the semiconductor element is a silicon (Si) chip or a silicon carbide (SiC) chip.

DESCRIPTION OF THE REFERENCE NUMERALS

1) semiconductor device
10) substrate
10*a*) main surface
10*b*) back surface
11) substrate body
12) inner body
12*a*) main surface
12*b*) back surface
12*c*) first side surface
12*d*) second side surface
12*e*) third side surface
13) projection
14) narrow portion
14*a*) recess
14*b*) recess
15) through hole
16) lead portion
17) terminal section
18) coupling section
18*a*) inclined part
18*b*) middle part
18*c*) bent
19*a*) flange
19*b*) flange
20) drive lead
20A) outer lead
20B) inner lead
21) drive pad
21*a*) first end portion
21*b*) second end portion
22) drive terminal
23) coupling portion
24) connection surface
24*a*) region
24*b*) region
30) control lead
30A) outer lead
30B) inner lead
31) control pad
31*a*) first end portion
31*b*) second end portion
32) control terminal
33) coupling portion
34) connection surface
34*a*) region
34*b*) region
40) semiconductor element
40*a*) main surface
40*b*) back surface
40*c*) side surface
48*d*) side surface
40*e*) side surface
40*f*) side surface 41) main surface drive electrode (main surface electrode)
42) back surface drive electrode (back surface electrode)
43) control electrode (main surface electrode)
50) drive wire
51) first end
52) second end
53) bonding portion
53a) region
53b) region
60) control wire
61) first end
62) second end
71 to 73) plated layer
80) encapsulation resin
81) first encapsulation resin side surface
82) second encapsulation resin side surface
82a) first inclined surface
83) third encapsulation resin side surface
84) fourth encapsulation resin side surface
85) encapsulation resin back surface
86) encapsulation resin top surface
101) semiconductor device
110) substrate
110a) main surface
110b) back surface
111) substrate body
112) inner body
112a) main surface
112b) back surface
112c) first side surface
112d) second side surface
112e) third side surface
113) projection
114) narrow portion
114a) recess
114b) recess
115) through hole
116) lead portion
117) terminal section
118) coupling section
118a) inclined part
118b) middle part
118c) bent
119b) flange
1119b) flange
120) drive lead
120A) outer lead
120B) inner lead
120T) projection
121) drive pad
121a) upper surface
121b) lower surface
112c) side surface
122) drive terminal
123) coupling portion
124) second base material
125) second plated layer
126) pad portion
126a) upper surface
126b) lower surface
126c) side surface
127) lead portion
127a) upper surface
127b) lower surface
127c) side surface
127d) end surface
130) control lead 130A) outer lead
130B) inner lead
130T) projection
131) control pad
131a) upper surface
131b) lower surface
131c) side surface
132) control terminal
133) coupling portion
134) third base material
135) third plated layer
136) pad portion
136a) upper surface
136b) lower surface
136c) side surface
137) lead portion
137a) upper surface
137b) lower surface
137c) side surface
137d) end surface
140) semiconductor element
140a) main surface
140b) back surface
140c) side surface
140d) side surface
140e) side surface
140f) side surface
141) main surface drive electrode
142) back surface drive electrode
143) control electrode
150) drive wire
151) first end
152) second end
154) third encapsulation resin side surface
160) control wire
161) first end
162) second end
180) encapsulation resin
181) first encapsulation resin side surface
182) second encapsulation resin side surface
182a) first inclined surface
183) third encapsulation resin side surface
184) fourth encapsulation resin side surface
185) encapsulation resin back surface
186) encapsulation resin top surface
201) first base material
202) first plated layer
W71, W72) width
X) longitudinal direction
Y) lateral direction
Z) thickness-wise direction

The invention claimed is:
1. A semiconductor device, comprising:
a substrate including a main surface;
a semiconductor element mounted on the main surface and including a main surface electrode oriented in the same direction as the main surface;
a connection pad formed of Cu, separated from the substrate in a first direction that is parallel to the main surface, and including a connection surface oriented in the same direction as the main surface;
a plated layer formed of Ni and partially covering the connection surface;
a wire formed of Al and including a first end bonded to the main surface electrode and a second end bonded to the plated layer; and an encapsulation resin encapsulating the semiconductor element, the connection pad, the plated layer, and the wire, wherein the connection surface includes a covered region that is covered by the plated layer and an exposed region that is exposed from the plated layer, and the covered region is located between a first part of the exposed region and a second part of the exposed region in the first direction when viewed from a thickness direction perpendicular to the main surface.

2. The semiconductor device according to claim 1, wherein the main surface electrode includes a control electrode and a drive electrode, the connection pad includes a control pad and a drive pad that are separated from the substrate in the first direction that is parallel to the main surface and separated from each other in a second direction, the second direction being parallel to the main surface and orthogonal to the first direction, and the wire includes a control wire connecting the control electrode and the control pad and a drive wire connecting the drive electrode and the drive pad.

3. The semiconductor device according to claim 2, wherein the control wire has a smaller diameter than the drive wire.

4. The semiconductor device according to claim 3, wherein the diameter of the control wire is 40 µm or greater and 100 µm or less, and the diameter of the drive wire is 200 µm or greater and 600 µm or less.

5. The semiconductor device according to claim 2, wherein the control wire includes a bonding portion bonded to the control pad and formed on a plated layer of the control pad, and the drive wire includes a bonding portion bonded to the drive pad, formed on a plated layer of the drive pad, and extending to the connection surface of the drive pad.

6. The semiconductor device according to claim 5, wherein the bonding portion of the drive wire at a region bonded to an upper surface of the plated layer has an area that is greater than or equal to a cross sectional area of the drive wire.

7. The semiconductor device according to claim 1, wherein the wire is bonded to the connection pad by ultrasonic bonding.

8. The semiconductor device according to claim 1, wherein the semiconductor element includes a back surface electrode faced away from the main surface electrode, the substrate is formed of Cu, and the back surface electrode is connected to the substrate by solder.

9. The semiconductor device according to claim 1, wherein the plated layer is a rough-surface plated layer having a rougher surface than the connection surface of the connection pad.

10. The semiconductor device according to claim 1, wherein when viewed from the thickness direction, the covered region is located between a third part of the exposed region and a fourth part of the exposed region in a second direction parallel to the main surface and perpendicular to the first direction.

11. The semiconductor device according to claim 10, wherein when viewed from the thickness direction, the covered region is surrounded by the exposed region.

12. The semiconductor device according to claim 2, an area of the covered region of the control pad is smaller than an area of the covered region of the drive pad.

13. The semiconductor device according to claim 5, wherein the bonding portion of the drive wire bonded to the drive pad includes:

a first bonding portion bonded to the upper surface of the plated layer, and a second bonding portion bonded to at least one of the exposed regions of the drive pad.

* * * * *